United States Patent [19]
Cotter et al.

[11] Patent Number: 5,852,415
[45] Date of Patent: Dec. 22, 1998

[54] CHARGE REDISTRIBUTION ANALOG-TO-DIGITAL CONVERTER WITH SYSTEM CALIBRATION

[75] Inventors: Martin G. Cotter, Ennis; Patrick J. Garavan, Limerick, both of Ireland

[73] Assignee: Analog Devices, Inc., Norwood, Mass.

[21] Appl. No.: 481,058

[22] Filed: Jun. 7, 1995

Related U.S. Application Data

[62] Division of Ser. No. 235,087, Apr. 29, 1994, abandoned.

[51] Int. Cl.$^6$ ........................................... H03M 1/10
[52] U.S. Cl. ........................... 341/120; 341/155; 341/172
[58] Field of Search .................................... 341/120, 139, 341/155, 172

[56] References Cited

U.S. PATENT DOCUMENTS

| | | | |
|---|---|---|---|
| 3,286,232 | 11/1966 | Stanford | 340/146.2 |
| 3,988,689 | 10/1976 | Ochi et al. | 330/51 |
| 4,077,035 | 2/1978 | Yee | 340/347 DA |
| 4,129,863 | 12/1978 | Grav et al. | 340/347 AD |
| 4,143,361 | 3/1979 | Tammes et al. | 341/120 |
| 4,144,527 | 3/1979 | Butler et al. | 341/347 AD |
| 4,180,807 | 12/1979 | Eichelberger et al. | 340/347 AD |
| 4,190,854 | 2/1980 | Redfern | 357/51 |
| 4,191,900 | 3/1980 | Redfern et al. | 307/355 |
| 4,222,107 | 9/1980 | Mrozowski et al. | 364/571 |
| 4,250,494 | 2/1981 | Butler et al. | 340/347 CC |
| 4,272,760 | 6/1981 | Prazak et al. | 340/347 CC |
| 4,295,089 | 10/1981 | Cooperman | 323/351 |
| 4,348,658 | 9/1982 | Carter | 340/347 AD |

(List continued on next page.)

FOREIGN PATENT DOCUMENTS

| | | |
|---|---|---|
| 0 021 650 A1 | 1/1981 | European Pat. Off. . |
| 0 064 147 | 11/1982 | European Pat. Off. . |
| 0 151 469 A3 | 8/1985 | European Pat. Off. . |
| 0 234 034 A1 | 9/1987 | European Pat. Off. . |
| 0 281 155 A2 | 9/1988 | European Pat. Off. . |
| 0 360 914 | 4/1990 | European Pat. Off. . |
| 2 174 288 | 10/1973 | France . |
| 2 314 617 | 1/1977 | France . |
| 2 351 544 | 12/1977 | France . |
| 2 386 939 | 11/1978 | France . |
| 2 447 119 | 8/1980 | France . |

(List continued on next page.)

OTHER PUBLICATIONS

Akazawa, Y. et al., New Linearity Error Correction Technology for A/D and D.A Converter LSI Japanese Journal of Applied Physics, vol. 22 (1983) Supplement 22–1, pp. 115–119.

Allstot, D. J. et al., "An Electrically–Programmable Switched Capacitor Filter," IEEE J. Solid–State Circuits, vol. SC–14, No. 6, Dec. 1979, pp. 1034–1041.

Allstot, D. J., "A Precision Variable–Supply CMOS Comparator," IEEE Journal Solid–State Circuits, vol. SC–17, No. 6, pp. 1080–1087, Dec. 1982.

Analog Devices, 1992 Data Converter Reference Manual, product #AD682, 4–41 and 4–47 to 4–48.

(List continued on next page.)

*Primary Examiner*—Brian K. Young
*Attorney, Agent, or Firm*—Wolf, Greenfield & Sacks

[57] ABSTRACT

A charge redistribution analog-to-digital converter. This converter includes an offset correcting circuit operatively connected in parallel with a capacitor array and responsive to a sampling input of the analog-to-digital converter, and a gain correcting circuit operatively connected in parallel with a sampling capacitor and responsive to the sampling input of the analog-to-digital converter. In another general aspect, an analog-to-digital converter calibration method for a charge redistribution analog-to-digital converter, that includes adjusting an input offset of an input of the analog-to-digital converter and adjusting a gain offset of the analog-to-digital converter. The steps of adjusting are then repeated until a predetermined level of error is achieved for the analog-to-digital converter.

41 Claims, 11 Drawing Sheets

U.S. PATENT DOCUMENTS

| | | | |
|---|---|---|---|
| 4,399,426 | 8/1983 | Tan | 340/347 CC |
| 4,429,282 | 1/1984 | Saari | 330/9 |
| 4,439,693 | 3/1984 | Lucas et al. | 330/9 |
| 4,458,237 | 7/1984 | Domogalla | 340/347 AD |
| 4,517,549 | 5/1985 | Tsukakoshi | 340/347 AD |
| 4,542,354 | 9/1985 | Robinton et al. | 332/11 D |
| 4,543,953 | 10/1985 | Slocum et al. | 128/419 PT |
| 4,553,052 | 11/1985 | Takahashi | 307/494 |
| 4,555,668 | 11/1985 | Gregorian et al. | 330/9 |
| 4,563,654 | 1/1986 | Arai et al. | 330/277 |
| 4,577,228 | 3/1986 | Arai et al. | 358/167 |
| 4,620,179 | 10/1986 | Cooper et al. | 340/347 AD |
| 4,654,815 | 3/1987 | Marin et al. | 364/606 |
| 4,677,422 | 6/1987 | Naito | 340/347 SH |
| 4,700,174 | 10/1987 | Sutherland et al. | 340/347 CC |
| 4,709,225 | 11/1987 | Welland et al. | 340/347 CC |
| 4,777,451 | 10/1988 | Tohyama | 330/253 |
| 4,803,462 | 2/1989 | Hester et al. | 341/172 |
| 4,804,960 | 2/1989 | Fernandes et al. | 341/158 |
| 4,812,817 | 3/1989 | Bernard | 341/172 |
| 4,829,266 | 5/1989 | Pernici et al. | 330/253 |
| 4,831,381 | 5/1989 | Hester | 341/172 |
| 4,833,418 | 5/1989 | Quintus et al. | 330/9 |
| 4,881,044 | 11/1989 | Kinoshita et al. | 330/253 |
| 4,883,987 | 11/1989 | Fattaruso | 307/355 |
| 4,907,002 | 3/1990 | Kawada | 341/172 |
| 4,982,194 | 1/1991 | Bacrania et al. | 341/172 |
| 5,006,853 | 4/1991 | Kiriaki et al. | 341/156 |
| 5,014,055 | 5/1991 | Dingwall et al. | 341/156 |
| 5,016,014 | 5/1991 | Bitting | 341/162 |
| 5,036,322 | 7/1991 | Barrow et al. | 341/144 |
| 5,043,732 | 8/1991 | Robertson et al. | 341/156 |
| 5,047,665 | 9/1991 | Burt | 307/355 |
| 5,077,489 | 12/1991 | Gola et al. | 307/362 |
| 5,124,663 | 6/1992 | McEntarfer et al. | 330/9 |
| 5,138,319 | 8/1992 | Tesch | 341/156 |
| 5,184,130 | 2/1993 | Mangelsdorf | 341/156 |
| 5,220,206 | 6/1993 | Tsang et al. | 307/296.3 |
| 5,233,180 | 8/1993 | Tsuruta et al. | 250/208.1 |
| 5,235,333 | 8/1993 | Naylor et al. | 341/118 |
| 5,245,223 | 9/1993 | Lim et al. | 307/362 |
| 5,248,974 | 9/1993 | Fattaruso et al. | 341/172 |
| 5,272,395 | 12/1993 | Vincelette | 307/362 |
| 5,381,148 | 1/1995 | Mueck et al. | 341/139 |
| B1 4,399,426 | 7/1987 | Tan | 340/347 CC |

FOREIGN PATENT DOCUMENTS

| | | |
|---|---|---|
| 27 27 634 | 12/1977 | Germany. |
| 28 14 754 A1 | 10/1978 | Germany. |
| 30 03 099 | 7/1980 | Germany. |
| 30 13 333 | 10/1980 | Germany. |
| 35 21 224 A1 | 12/1986 | Germany. |
| 53-42438 | 10/1979 | Japan. |
| 919076 | 9/1982 | U.S.S.R.. |
| 1402698 | 8/1975 | United Kingdom. |
| 1518558 | 7/1978 | United Kingdom. |
| 2 008 350 | 5/1979 | United Kingdom. |
| WO 82/00390 | 2/1982 | WIPO. |
| WO 93/19534 | 9/1993 | WIPO. |

OTHER PUBLICATIONS

Analog Devices, Preliminary Technical Data, product #AD7882, Sep. 1993, pp. 1–12.

Beresford. R., "A self–calibrating d–a converter." Electronics, Sep. 22, 1981, p. 144.

Bienstman, L. A. et al., "An 8–Channel 8b µP Compatible NMOS Converter with Programmable Ranges." 1980 IEEE International Solid–State Circuits Conference, pp. 16–17.

Bienstman, L. A. et al., "An Eight–Channel 8 Bit Microprocessor Compatible NMOS D/A Converter with Programmable Scaling," IEEE J. Solid–State Circuits, vol. SC–15, No. 6, Dec. 1980, pp. 1051–1058.

Bon, M. et al., "All–Symbolic Analysis Technique for Multiphase Switched Capacitor Networks." pp. 655–660 (no date given).

Cooperman, M. et al., "Charge Redistribution Codec," J. Solid–State Circuits, vol. SC–16, No. 3, pp. 155–162, Jun. 1981.

Crystal Semiconductor Corporation, "16–Bit, 100 kHz Serial–Output A/D Converter", Preliminary Product Information, DS45PP2, Jan. 1989, pp. B–95–B115.

Dannenberg, R. E., "Closed Loop Digital–to–Analog Conversion," IBM Technical Disclosure Bulletin, vol. 20, No. 6, pp. 2332–2333, Nov. 1977.

De Wit, M. et al., "A Low–Power 12–b Analog–to–Digital Converter with On–Chip Precision Trimming," IEEE J. of Solid–State Circuits, vol. 28, No. 4, Apr. 1993, pp. 455–461.

Dobberstein, E. A., "Auto–Preregulating Coverter with Surge Control," IBM Technical Disclosure Bulletin, vol. 23, No. 8, pp. 3556–3558, Jan. 1981.

Eriksson, S., "Realization of Synchronous Wave Switched–Capacitor Filters," Dept. of Electrical Eng, Linköping, University, Linköping, Sweden, pp. 650–654 (no date given).

Fiedler, H. L. et al., "A 5–Bit Building Block for 20 Mhz A/D Converters," IEEE J. Solid–State Circuits, vol. SC–16, No. 3, pp. 151–155 Jun. 1981.

Fotouhi, B. et al., "An NMOS 12b Monotonic 25µs A/D Converter," 1979 IEEE International Solid–State Circuits Conference, pp. 186–187.

Fotouhi, B. et al., "High–Resolution A/D Conversion in MOS/LSI," IEEE J. Solid–State Circuits, vol. SC–14, No. 6, Dec. 1979, pp. 920–926.

Gheewala, T. R., "Parallel, Flux Redistribution D/A and A/D Converters," IBM Technical Disclosure Bulletin, vol. 20, No. 6, pp. 2480–2482, Nov. 1977.

Gillis, M. A. et al., "Supply Tracking Digital–to–Analog Converter," IBM Technical Disclosure Bulletin, vol. 20, No. 11A, Apr. 1978, pp. 4507–4508.

Gregorian, R. et al., "Offset Free High–Resolution D/A Converter," American Microsystems, Inc., Santa Clara, CA, 1980, pp. 316–319.

Gregorian, R., "High–resolution switched–capacitor D/A converter," Microelectronics Journal, vol. 12, No. 2, 1981, pp. 10–13.

Gregorian, R. et al., "An Integrated Single–Chip PCM Voice Codec with Filters," IEEE J. Solid–State Circuits, vol. SC–16, No. 4, Aug. 1981, pp. 322–333.

Hague et al., "Two Chip PCM Voice Codec with Filters," IEEE J. Solid–State Circuits, vol. SC–14, No. 6, Dec. 1979, pp. 963–964.

Hamade, A. R. et al., "A Single–Chip 8–Bit A/D Converter," IEEE J. Solid–State Circuits, Dec. 1976, vol. SC–11, No. 6, pp. 154–155.

Hampel, D. et al., "Application of Monolithic CMOS Switched–Capacitor Filters and Amplifiers for Signal Processing," IEEE Trans. on Communications, vol. COM–28, No. 10, Oct. 1980, pp. 1828–1831.

Herbst, D. et al., "Master–Slice SC Filters," Lehrstuhl Bauelemente der Electrotechnik, University of Dortmund, West Germany, pp. 639–643 (no date given).

Holloway, L., "Elimination of Offset During Analog–to–Digital Conversion," IBM Technical Disclosure Bulletin, vol. 19, No. 9, Feb. 1977, pp. 3610–3611.

Hornak, T. et al., "A High Precision Component–Tolerant A/D Converter," IEEE J. Solid–State Circuits, vol. SC–10, No. 6, Dec. 1975, p. 386.

Iwata, A. et al., "Low Power PCM CODEC and Filter System," IEEE J. Solid–State Circuits, vol. SC–16, No. 2, Apr. 1981, pp. 73–79.

Kleine, U. et al., "Real–Time Programmable Unit–Element SC Filter for LPC Synthesis," Electronics Letters, Aug. 20, 1981, vol. 17, No. 17, pp. 600–602.

Kurth, C. F. et al., "Two–Port Analysis of Cascaded Swiched–Capacitor Networks," IEEE 1978.

Kurth, C. F., "Two–Port Analysis of SC Networks with Continuous Input Signals," The Bell System Technical Journal, vol. 59, No. 8, Oct. 1980, pp. 1297–1316.

Lee, H.S. et al., "Self–Calibration Technique for A/D Converters," IEEE Trans. on Circuits and Systems, vol. CAS–30, No. 3, Mar. 1983, pp. 188–190.

Lee, H. S. et al., "A Self–Calibrating 12b 12$\mu$s CMOS ADC," 1984 IEEE International Solid–State Circuits Conference, pp. 64–65, 319.

Lee, H. S. et al., "Accuracy Considerations in Self–Calibrating A/D Converters", IEEE Trans. on Circuits and Systems, vol. CAS–32, No. 6, Jun. 1985, pp. 590–597.

Lee, H. S. et al., "A Direct Code Error Calibration Technique for Two–Step Flash A/D Converters," IEEE Trans. Circuits Syst., vol. 36, No. 6, pp. 919–922, Jun. 1989.

Lueder, E. et al., "Equivalent Sampled Data Filter Structures adn Some of Their Properties," IEEE 1978, pp. 752–755.

Maio, K. et al., "An Untrimmed D/A Converter with 14–Bit Resolution," J. Solid–State Circuits, vol. SC–16, No. 6, pp. 616–620, Dec. 1981.

McCreary, J.L. et al., "All–MOS Charge Redistribution Analog–to–Digital Conversion Techniques—Part I", IEEE J. Solid–State Circuits, SC–10, Dec. 1975, pp. 371–379.

McCreary, J. L. et al., "Precision Capacitor Ratio Measurement Technique for Integrated Circuit Capacitor Arrays," IEEE Trans. on Instrumentation and Measurement, vol. IM–28, No. 1, Mar. 1979, pp. 11–17.

Poujois, R. et al., "A Low Drift Fully Integrated MOSFET Operational Amplifier," IEEE Journal Solid–State Circuits, vol. SC–13, No. 4, Aug. 1978, pp. 499–503.

Pryce, D., "Self–Calibrating A/D Converters, Monolithic devices enhance accuracy and linearity," EDN, Jan. 20, 1992, pp. 53–64.

Rosenthal, L. A., "Improved Frequency Meter Circuit," IEEE Trans. on Instrumentation and Measurement, vol. IM–26, No. 4, Dec. 1977, p. 421.

Schulz, R. A. et al., "Analog–To–Digital Converter with Noise Rejection", IBM Technical Disclosure Bulletin, vol. 15, No. 6, Nov. 1972, pp. 2007–2008.

Schweer, B. et al., "Synthesis and Analysis Programs for VIS–SC Filters," Lehrstuhl Bauelemente der Elektrotechnik, University of Dortmund, West Germany, pp. 644–648 (no date given).

Suarez, R. E. et al., "All–MOS Charge Redistribution Analog–to–Digital Conversion Techniques—Part II," IEEE J. Solid–State Circuits, vol. SC–10, No. 6, Dec. 1975, pp. 379–384.

Tan, K. S., et al. "A 5V, 16b 10$\mu$s Differential CMOS ADC", 1990 IEEE International Solid State Circuits Conference, pp. 166–167.

Timko, M. P., "Circuit Techniques for Achieving High Speed–High Resolution A/D Conversion," IEEE J. Solid–State Circuits, vol. SC–15, No. 6, Dec. 1980, pp. 1040–1050.

Tröster, G. et al. "Error Cancellation Technique for Capacitor Arrays in A/D and D/A Converters," IEEE Trans Circuits Syst., vol. 35, No. 6, pp. 749–751, Jun. 1988.

Yamakido, K. et al., "A Single–Chip CMOS Filter/Codec," J. Solid–State Circuits, vol. SC–16, No. 4, Aug. 1981, pp. 302–307.

Yee, Y.S., "Adaptive Reference Voltage Adjustment for an Analog–to–Digital Converter", IBM Technical Disclosure Bulletin, vol. 19, No. 6, Nov. 1976, pp. 2360–2362.

Yee, Y.S. et al., "A Two–Stage Weighted Capacitor Network for D/A–A/D Conversion", IEEE J. Solid–State Circuits, vol. SC–14, No. 4, Aug. 1979, pp. 778–781.

5,852,415

CHARGE REDISTRIBUTION ANALOG-TO-DIGITAL CONVERTER WITH SYSTEM CALIBRATION

This application is a division of application Ser. No. 08/235,087, filed Apr. 29, 1994, entitled CHARGE REDISTRIBUTION ANALOG-TO-DIGITAL CONVERTER WITH SYSTEM CALIBRATION and now abandoned.

FIELD OF THE INVENTION

This invention relates to CMOS charge redistribution analog-to-digital converters.

BACKGROUND OF THE INVENTION

Complementary Metallic Oxide Semiconductor (CMOS) integrated circuit technology is relatively inexpensive, and it allows designers to include some digital logic circuitry and some analog circuitry in the same integrated circuit. Using this technology, designers have implemented analog-to-digital converter integrated circuits, which measure an analog voltage and convert it to a corresponding digital representation. Because it is generally difficult to produce accurate resistors using CMOS technology, the technique of charge redistribution, which uses capacitors instead of resistors, has been used in some CMOS analog-to-digital converters.

Referring to FIG. 1, a simple six-bit analog-to-digital converter circuit which uses the prior art technique of charge redistribution includes an array of binary-weighted capacitors C0–C5. These capacitors have one terminal commonly connected to the non-inverting input (+) of a comparator CP, and this comparator input is also connected to a grounding switch SA. A series of array switches S0–S5 can individually connect the other terminal of each of the capacitors either to ground or to an input node IN. An input switch SB can, in turn, switch the input node between an input voltage Vin and a reference voltage Vref.

The circuit performs an analog-to-digital conversion in a three-step operation. First is a sampling step in which the common terminal of the capacitors is grounded by the grounding switch SA, and the second terminal of each of the capacitors is connected to the input voltage via the array switches S0–S5 and the input switch SB. At the end of this first step, the capacitors collectively store a charge proportional to the input voltage.

A holding step follows the sampling step. In this holding step, the common switch SA opens so that the common terminals of the capacitors are no longer grounded, and the series of switches S0–S5 are actuated so that the second terminals of the capacitors are grounded. During the holding step, the voltage at the first terminal of the capacitors, which is presented to the comparator, is equal to the input voltage.

The third step is a charge redistribution step, in which the input switch connects the input node to the reference voltage Vref, and the circuit iteratively derives a digital representation of the analog input voltage. In a first iteration, the first array switch S0 switches the second terminal of the largest capacitor in the array C0 (corresponding to the most significant bit or "MSB") from ground to the reference voltage. This creates a voltage divider between two essentially equal capacitances, which sets the voltage measured by the comparator equal to about half of the difference between the reference voltage and the, input voltage.

If the comparator detects a voltage above ground in this first iteration, the bit corresponding to the first capacitor (MSB) is set to zero (in logic circuitry receiving the output of the comparator, but not shown, for simplicity). Conversely, if the voltage detected at the comparator input is below ground, the bit is set to one. The first array switch S0 then grounds the second terminal of the MSB capacitor C0, but only if the comparison resulted in a digital bit value of zero. The circuit repeats these voltage divider operations in succession for each capacitor until capacitor C5, corresponding to the least significant bit (LSB), has been tested. The entire three-step conversion process can then start again with a second sampling step.

In a modified version of this circuit, the voltage supplied to the comparator ranges from ground to the reference voltage, rather than varying above and below ground by the reference voltage. This modification can be achieved by supplying Vin to the non-inverting input of the comparator through a sampling capacitor, instead of supplying it as an alternative to the reference voltage. In addition, the inverting input of the comparator is set to a potential halfway between ground and the reference voltage.

A different operating sequence allows these types of converters to perform bipolar measurements. This sequence begins with the second terminal of the largest capacitor connected to the reference voltage during the sampling step. The circuit then tests each bit in the same manner as is described above, except that the first array switch switches the largest capacitor from the reference voltage to ground during its test instead of switching it from ground to the reference voltage. If the comparator detects a negative voltage on any of the tests, the corresponding bit is set to one, as described above. The resulting digital value is a 1's complement number, which can be either negative or positive, depending on the value of the most significant bit. In essence, this mode of operation employs the largest capacitor to level shift the voltage at the input to the capacitor.

These prior art charge redistribution techniques are well suited for operation with a system using split voltage supplies. They are not optimum, however, for a system that uses a single supply, particularly a single low-voltage supply.

In "Adaptive Reference Voltage Adjustment for an Analog-to-Digital Converter," *IBM Technical Disclosure Bulletin*, Vol. 19, No. 6, November 1976, Y. S. Yee proposes to adaptively adjust the reference voltage of an analog-to-digital converter by providing an on-chip continuously self-calibrating subsystem. This subsystem provides a second weighted capacitor ladder in the feedback path of an amplification circuit on the output of the converter's main capacitor ladder. This second ladder is adjusted to compensate for differences in the reference voltage during a calibration operation. This is said to enable the analog-to-digital converter to operate without a precision reference voltage supply, and to eliminate the need for potentiometer adjustment calibrations.

The Yee system does not, however, permit calibration for both gain and offset errors.

SUMMARY OF THE INVENTION

In general, the invention features a charge redistribution analog-to-digital converter. This converter includes an offset correcting circuit operatively connected in parallel with a capacitor array and responsive to a sampling input of the analog-to-digital converter, and a gain correcting circuit operatively connected in parallel with a sampling capacitor and responsive to the sampling input of the analog-to-digital converter.

In another general aspect, the invention features a analog-to-digital converter calibration method for a charge redistribution analog-to-digital converter, that includes adjusting an input offset of an input of the analog-to-digital converter and adjusting a gain offset of the analog-to-digital converter. The steps of adjusting are then repeated until a predetermined level of error is achieved for the analog-to-digital converter.

The invention is advantageous in that it permits on-chip calibration of offset and gain for a charge redistribution analog-to-digital converter, resulting in improved converter accuracy, without the expense of additional external circuitry.

The converter's comparator common-mode input voltage can be quite low, as low as a quarter of the reference voltage, or even lower. Because this voltage is low, the gates of the switching transistors that feed the comparator can be driven with relatively high gate-source voltages, even when the converter's supply voltage is low (e.g., under five volts, or even under three volts). This allows for faster operation, lower switch leakage, and lower switch "on" resistance. It also permits the use of smaller switching transistors, which may have reduced feedthrough capacitance.

DETAILED DESCRIPTION

Figure 1:
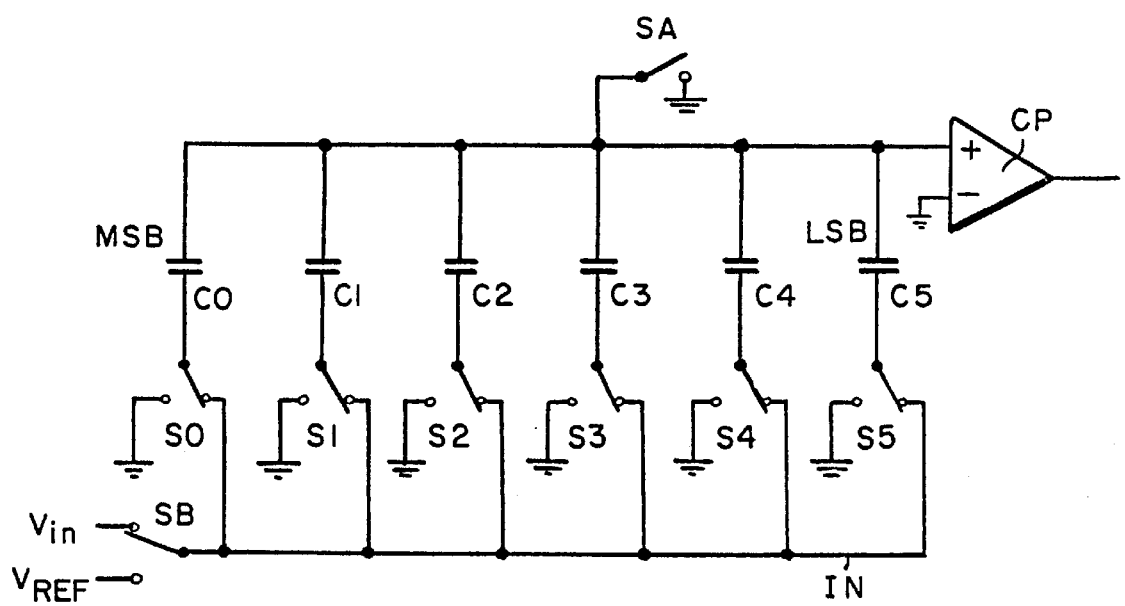
FIG. 1 is a schematic circuit diagram of a simple six-bit analog-to-digital converter illustrating the prior art principle of charge redistribution.
Figure 2:
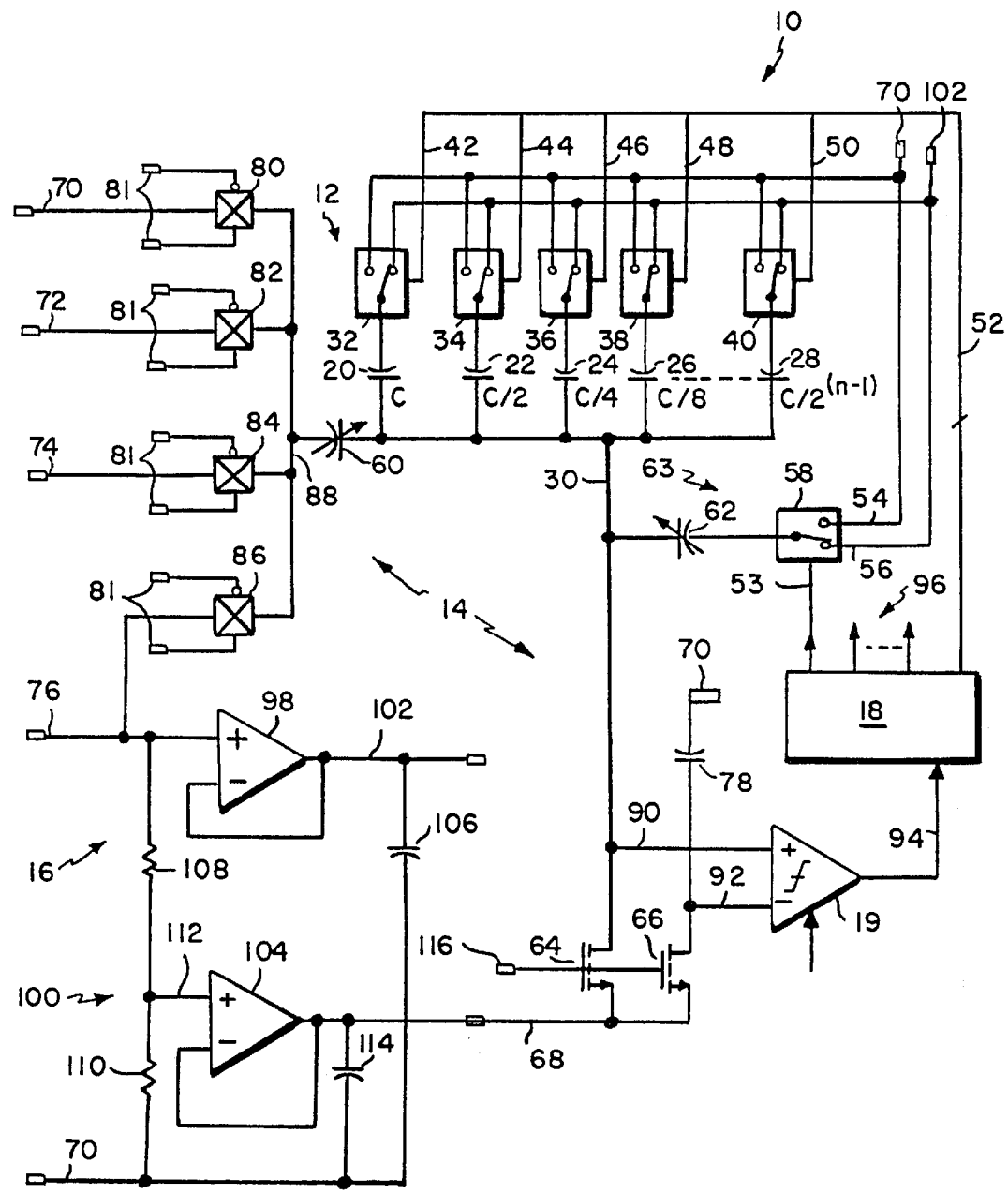
FIG. 2 is a block diagram of an example of a CMOS analog-to-digital converter according to the invention.

As shown in FIG. 2, an example of an analog-to-digital converter 10 according to the invention includes a digital-to-analog converter (DAC) 12, a track-and-hold circuit 14, reference buffering circuitry 16, and a digital controller 18. The DAC consists of an array of binary-weighted capacitors 20, 22, 24, 26 and 28. The illustrated embodiment employs fourteen such capacitors, although the principles of the invention are not limited to this number.

The first capacitor 20 in the array has twice the capacitance of the second capacitor 22, which in turn has twice the capacitance of the third capacitor 24. This pattern is repeated for the remaining capacitors, including the last capacitor 28. This last capacitor therefore has a capacitance $2^{n-1}$ times smaller than the capacitance of the first capacitor in the array, where n is the number of capacitors in the array. A first terminal of each of the capacitors in the array is connected to a DAC common node 30.

The second terminal of the first capacitor 20 is connected to a first DAC switch 32, the second terminal of the second capacitor 22 is connected to a second DAC switch 34, the second terminal of the third capacitor 24 is connected to a third DAC switch 36, and the second terminal of the fourth capacitor 26 is connected to a fourth DAC switch 38. Similarly, the remaining capacitors each have a second terminal connected to a corresponding DAC switch, such that the second terminal of the last capacitor 28 is connected to the last DAC switch 40.

Each of the DAC switches 32, 34, 36, 38, 40 is responsive to a corresponding control line 42, 44, 46, 48, 50 from a control bus 52. The DAC switches also each have a first output tied to a buffered reference voltage node 102 and a second output tied to ground 70. It is noted that "ground" need not be an absolute ground potential, but can refer to an ungrounded power supply line.

The track-and-hold (T/H) circuit 14 has four input terminals, which include a ground terminal 70, a positive analog input terminal 72, a negative analog input terminal 74, and a reference input terminal 76. In the present embodiment, the reference input receives the single supply voltage of the analog-to-digital converter integrated circuit, but this is not a necessity to the invention. A first input switch 86 is placed between the reference input terminal and a common input node 88. A second input switch 84 is placed between the negative analog input terminal and the common input node. A third input switch 82 is placed between the positive analog input terminal and the common input node. A fourth input switch 80 is placed between the ground terminal and the common input node. Each of these input switches responds to control signals on one of a series of respective switch control lines 81. Collectively, the input switches function as an input multiplexer.

The track-and-hold circuit 14 also includes a sampling capacitor 60 between the common input node 88 and the DAC common node 30. This capacitor has a capacitance C equal to the aggregate capacitance of the DAC 12, minus a capacitance equal to that of the LSB capacitor 28. A first NMOS switch 64 is connected in an electrical path between the DAC common node 30 and a buffered common-mode voltage node 68. A second NMOS switch 66 is connected in a path between the buffered common-mode voltage node and the first terminal of a dummy array capacitor 78. The dummy array capacitor has a capacitance equal to that of the DAC 12 and the sampling capacitor 60 in combination (i.e., 4C), and a second terminal 70 of the dummy array capacitor is grounded. A hold line 116 provides a digital CMOS hold signal to the gates of the two NMOS switches.

The analog-to-digital converter 10 also includes a comparator 19, which may be a precision CMOS comparator, such as the comparator described in a co-pending application titled "Low-Voltage CMOS Comparator," filed on the same day as the present application and herein incorporated by reference. This comparator has a non-inverting input 90 connected to the DAC common node 30, and an inverting input 92 connected to the first terminal of the dummy array capacitor 78. The comparator also has a latched digital output 94, which is provided to the digital controller 18.

The digital controller 18 includes digital circuitry which receives the output of the comparator and supplies control signals 96 for operation of the system 10. For example, the controller provides control signals to the DAC control bus 52, the hold line 116, the switch control lines 81, and a calibration control line 53. The digital controller also includes digital interface circuitry for communicating conversion values to external circuits, such as microprocessors. The digital controller's circuitry can be implemented using known, straightforward sequential digital logic circuitry design techniques, in order to achieve operation according to the invention as described herein.

An offset calibration circuit 63 is connected between the common node 30, ground 70, and the buffered reference voltage node 102. This circuit includes a capacitive trim array 62 and a trim switch array 58 (controlled by controller 18), which are used in calibration operations. The sampling capacitor 60 is also associated with a trim array, and calibration of these elements is described below in more detail in the description of the second embodiment.

The reference buffering circuitry 16 includes a first follower amplifier 98 responsive to the reference input terminal 76 to provide a buffered reference voltage on its output 102. An on-chip output capacitor 106 provided between this output and ground 70 smoothes the buffered voltage. This capacitor preferably has a capacitance of ten times the capacitance of the largest capacitor 20 in the DAC array.

The input buffering circuitry 16 also includes a voltage divider 100 made up of first and second resistors 108, 110 between the reference input terminal 76 and ground 70. The first resistor 108 can have twice the resistance of the second resistor 110 to divide the reference voltage by three, as discussed below. A second follower amplifier 104 receives the output of the voltage divider from a node 112 between the first and second voltage divider resistors. The second follower amplifier has an output connected to the buffered common-mode voltage node 68, and a second output capacitor 114 is provided between this output and ground.

Figure 3:
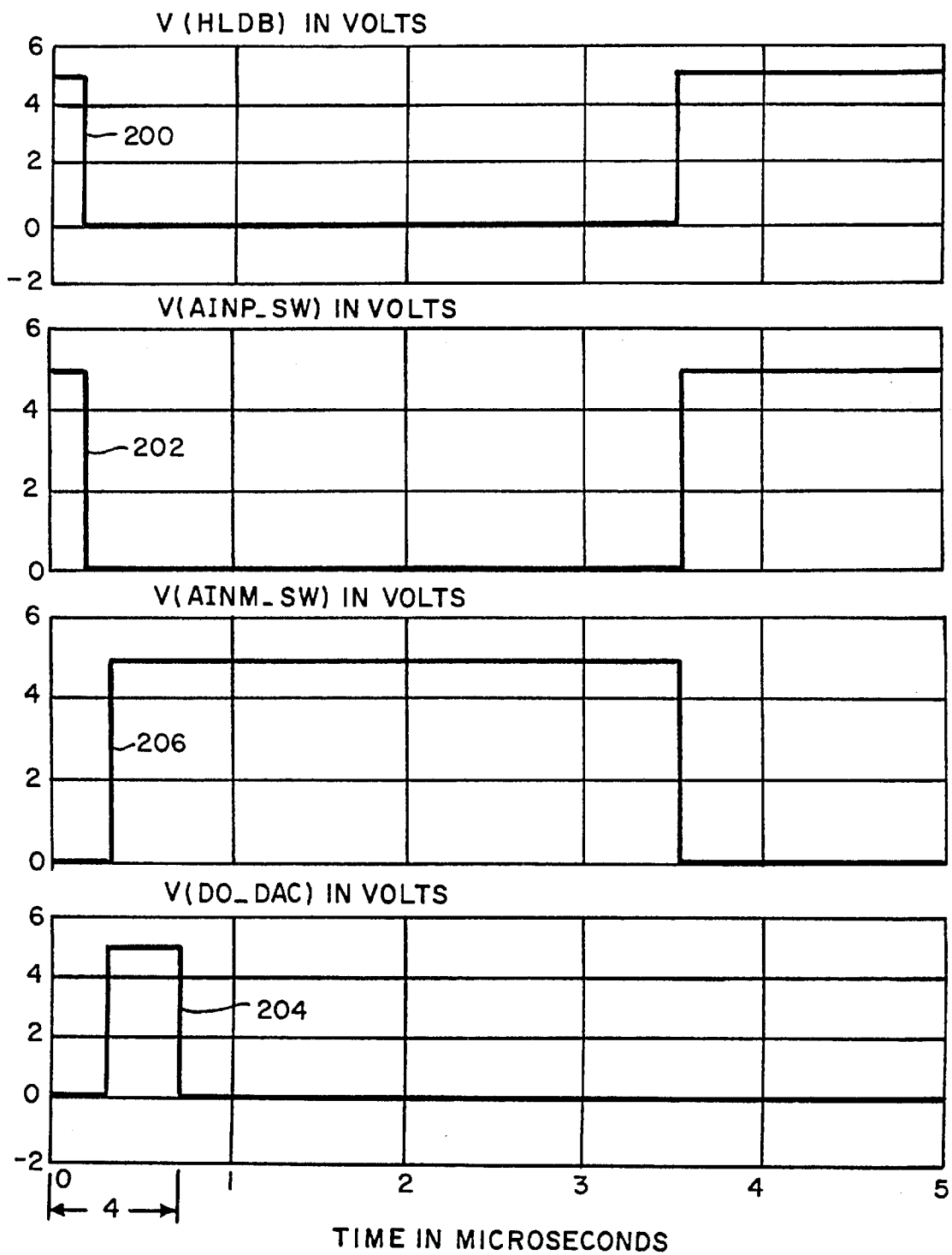
FIG. 3 is a timing diagram illustrating the operation of the converter of FIG. 2 in its unipolar mode.
Figure 4:
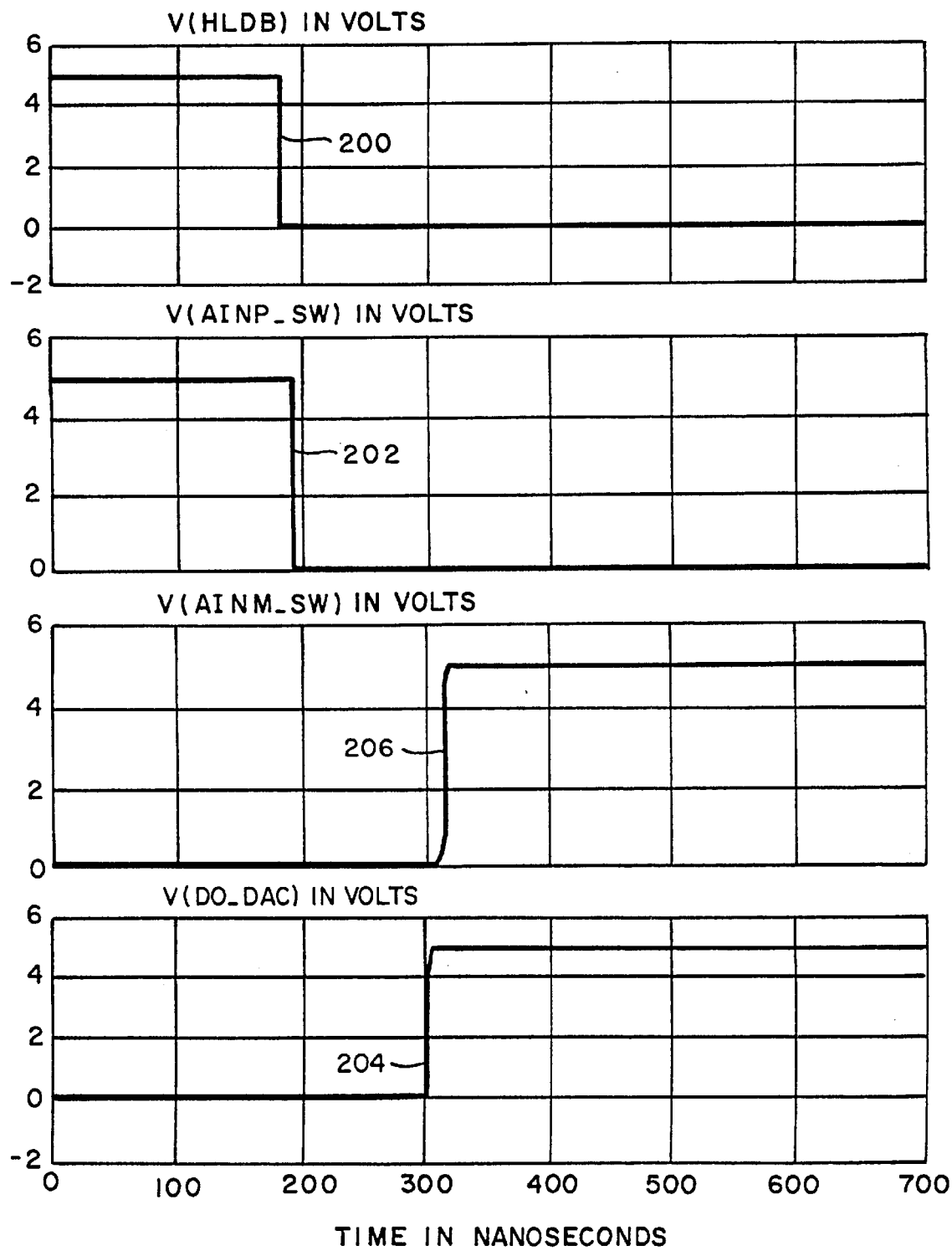
FIG. 4 is a timing diagram presenting the first 700 nanoseconds of the timing diagram of FIG. 3 on an expanded time scale, as indicated by the label "4" in FIG. 3.

In operation, referring to FIGS. 2–4, the track-and-hold circuit 14 first acquires a signal sample, and the digital-to-analog converter 12 is then used to convert the sample into a digital value. There are two different modes of sampling which are selected by the state of a signal on a digital input pin. The first is a unipolar mode, which expresses the voltage difference between the positive analog input terminal 72 and the negative analog input terminal 74 as an unsigned voltage difference from the negative analog input terminal. The second is a bipolar mode, which expresses a difference between a voltage at the negative analog input terminal and a voltage at the positive analog input terminal as a signed value, with a zero value indicating that the positive analog input terminal and the negative analog input terminal are at equal voltages.

The unipolar mode of operation begins with an acquisition phase, in which all of the DAC switches 32, 34, 36, 38, 40 connect their respective array capacitors 20, 22, 24, 26, 28 to ground 70. During this phase, the third input switch 82, which is on, connects a positive voltage to be measured on the positive analog input terminal 72 to the first terminal of the sampling capacitor 60. The first 86, second 84, and fourth 80 input switches are all off. The first NMOS switch 64, which is on, connects the DAC common node 30 to the buffered common-mode voltage node 68. The second NMOS switch 66 is also on, and it connects the dummy array capacitor 78 to the common-mode voltage node 68. The inverting input 92 and non-inverting input 90 of the comparator 19 are therefore at the same common-mode voltage Vb during this phase. Vb is developed by the second follower amplifier 104 and the voltage divider 100.

A hold mode then begins with the hold line 116 going low (step 200). This opens both the first and second NMOS switches and thereby traps a signal charge on the comparator inputs 90, 92. Next, the third input switch 82 opens (step 202), which isolates the positive analog input terminal 72 (Ainp) from the sampling capacitor 60.

The first DAC switch 32 then connects the second terminal of the first DAC capacitor 20 to the buffered reference voltage output 102 (Vrefd) (step 204). The voltage V(ncp) at the non-inverting comparator input 90 now has an intermediate value of:

$$V(ncp) = Vb + Vrefd/2 \tag{Eq. 1}$$

The next operation is to close the second input switch 84 (step 206). This connects the sampling capacitor 60 to the negative analog input voltage terminal 74 (Ainm). The voltage at the non-inverting comparator input 90 can now be determined by applying the principle of charge conservation. This voltage is given by:

$$V(ncp) = Vb + \frac{Vrefd^*C^* \sum_{j=0}^{n-1}(b_j^*2^{-j}) - 2^*C^*(Ainp - Ainm)}{Ctot} \tag{Eq. 2}$$

$$\text{where } Ctot = 4^*C + Cp \approx 5^*C \tag{Eq. 3}$$

where Ctot is the total capacitance on the DAC common node 30, which includes the capacitance of the DAC 12 (2C), the capacitance of the sampling capacitor 60 (2C), and any (undesirable) parasitic capacitance Cp on the node, such as the input capacitance of the comparator 19. The digital bits $b_j$ each have values of either 0 or 1. The voltage V(ncm) at the inverting input 92 is given by:

$$V(ncm) = Vb \tag{Eq. 4}$$

Initially, the voltage V(ncp) at the non-inverting input has a value of:

$$V(ncp) = Vb + \frac{(Vrefd^*C) - 2^*C^*(Ainp - Ainm)}{Ctot} \tag{Eq. 5}$$

In this mode of operation, the range of values of the term (Ainp–Ainm) is:
0 to Vrefd
Therefore the minimum value of V(ncp) is:

$$V(ncp) = Vb - Vrefd(C/Ctot) \tag{Eq. 6}$$

And the maximum value of V(ncp) is:

$$V(ncp) = Vb + Vrefd(C/Ctot)$$

These results indicate that setting the voltage Vb equal to Vrefd(C/Ctot) will prevent the input voltage of the comparator from becoming more negative than ground. It is apparent from the above that the common-mode voltage Vb, which is developed by the second follower amplifier 104 and the voltage divider 100, can theoretically be as low as ⅕ of the reference voltage. In order to account for drifts and tolerances, however, it is preferable to set this voltage to a somewhat higher voltage, such as a quarter or a third of the reference voltage.

By using this lower common-mode voltage, the NMOS switches 64, 66 can be driven by a relatively higher gate-source voltage than they would if the common-mode voltage were to be set to Vrefd/2. This allows for faster operation, lower switch leakage, and lower switch "on" resistance. It also permits the use of smaller switching transistors, which may have a reduced feedthrough capacitance.

The timing of the actuation of the first DAC switch (step 204), which connects the first DAC capacitor 20 to the buffered reference voltage node 102, allows for the lowered common-mode voltage Vb. As presented above, this actuation takes place after the opening of the third input switch 82 (step 202), which isolates the positive analog input terminal 72 from the sampling capacitor, but before the closing of the second input switch 84 (step 206), which connects the sampling capacitor to the negative analog input voltage terminal 74. This timing scales the range of voltages presented to the comparator during the later charge redistribution to be between Vb−Vrefd(C/Ctot) and Vb+Vrefd(C/Ctot).

The bipolar mode of operation (not shown in FIGS. 3 and 4) is similar to the unipolar mode, except that its acquisition phase begins with the DAC switches 32, 34, 36, 38, 40 connected to ground 70 and the first DAC switch connected to the buffered reference voltage node 102, which allows for bipolar operation. The third input switch 82, which is on, then connects the positive input voltage on the positive analog input terminal 72 to the sampling capacitor 60. The first 86, second 84, and fourth 80 input switches are off. The first NMOS switch 64, which is on, connects the DAC common node 30 to the buffered common-mode voltage node 68. The second NMOS switch 66 is also on, and connects the dummy array capacitor 78 to the buffered common-mode voltage node as well. Therefore, both inputs of the comparator 90, 92 are at the same common-mode voltage Vb during this phase.

The hold mode begins with the receipt of a hold command on the hold line 116, from the digital controller 18. This causes both of the NMOS switches 64, 66 to open, which traps a signal charge on the comparator input nodes. Next, the third input switch 82 opens, isolating the positive input terminal 72 from the sampling capacitor 60. The second input switch 84 then closes, which connects the sampling capacitor 60 to the negative analog input terminal 74. The voltage at the non-inverting comparator input 90 can now be determined by applying the principle of charge-conservation. This voltage is given by:

$$V(ncp) = Vb + \frac{Vrefd*C* \sum_{j=0}^{n-1}(b_j*2^{-j}) - 2*C*(Ainp - Ainm) - Vrefd*C}{Ctot} \quad \text{(Eq. 7)}$$

where $Ctot = 4*C + Cp \approx 5*C$ (Eq. 8)

The voltage at the inverting input 92 is given by:

$$V(ncm) = Vb \quad \text{(Eq. 9)}$$

Initially, the voltage V(ncp) at the non-inverting input has a value of:

$$V(ncp) = Vb - \frac{2*C*(Ainp - Ainm)}{Ctot} \quad \text{(Eq. 10)}$$

In this mode of operation, the range of values of the term (Ainp−Ainm) is:

±Vrefd/2

Therefore, the minimum value of V(ncp) is:

$$V(ncp)_{min} = Vb - Vrefd(C/Ctot) \quad \text{(Eq. 11)}$$

This result is the same as that reached for the unipolar mode, which permits Vb to be set to the same reduced voltage for both modes.

Figure 5:
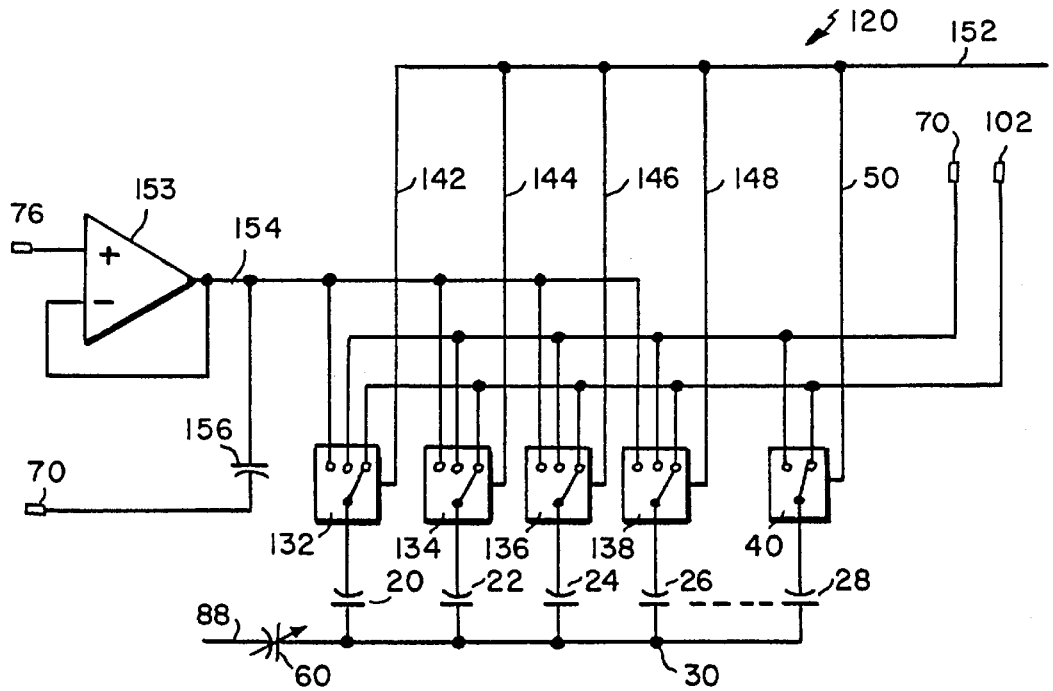
FIG. 5 is a schematic circuit diagram of precharge circuitry for use with an analog-to-digital converter according to the invention.

After the second input switch 84 is closed in either mode, the DAC array is used to measure the trapped charge. Referring to FIG. 5, this measurement is preferably performed in connection with precharge circuitry 120, which may be substituted into the analog-to-digital converter 10 to achieve higher speeds, more precise operation, or both. In this precharge circuitry, some of binary-weighted capacitors 20, 22, 24, 26 are connected to respective three-way DAC switches 132, 134, 136 and 138, instead of being connected to two-way DAC switches. The last capacitor 28, however, is connected to a two-way switch 40 as described above in connection with FIG. 2. Similarly, the next-to-last capacitor (not shown) is connected to a two-way switch.

The three-way DAC switches 132, 134, 136, 138 are configured to selectively connect the second terminal of their respective capacitors to either the buffered reference voltage node 102, ground 70, or a precharge reference voltage node 154. The three-way switches 132, 134, 136 and 138 can be made up of a pair of transmission gates and a grounding switch, and are responsive to corresponding control lines 142, 144, 146 and 148, which form part of a precharge control bus 152. The precharge circuitry 120 includes a third follower amplifier 153, which receives the reference voltage from the reference input terminal 76, and buffers it onto the precharge reference voltage node 154. A precharge output capacitor 156 provided between this node and ground 70 smoothes the precharge reference voltage. This capacitor preferably has a capacitance of ten times the capacitance of the largest capacitor 20 in the DAC array.

In operation, the precharge reference voltage 154 initially provides the bulk of the charge on each capacitor in the array, and the buffered reference voltage 102 provides the remainder of the charge. This operation minimizes the disturbance of the reference voltage node 102, and as a result minimizes its settling time. This can result in faster conversions, more precise conversions, or both.

The use of precharge circuitry may also eliminate the need for an external capacitor on the buffered reference voltage node 102. This can reduce the cost of the integrated circuit, and that of its surrounding circuitry. And because there are no bond wires or external leads, the inductance at the output of the capacitor is lower, which increases operating speed. Furthermore, because the precharge capacitor 156 is on-chip, its associated parasitic inductance is lower as well, which increases precharge speed.

Figure 6:
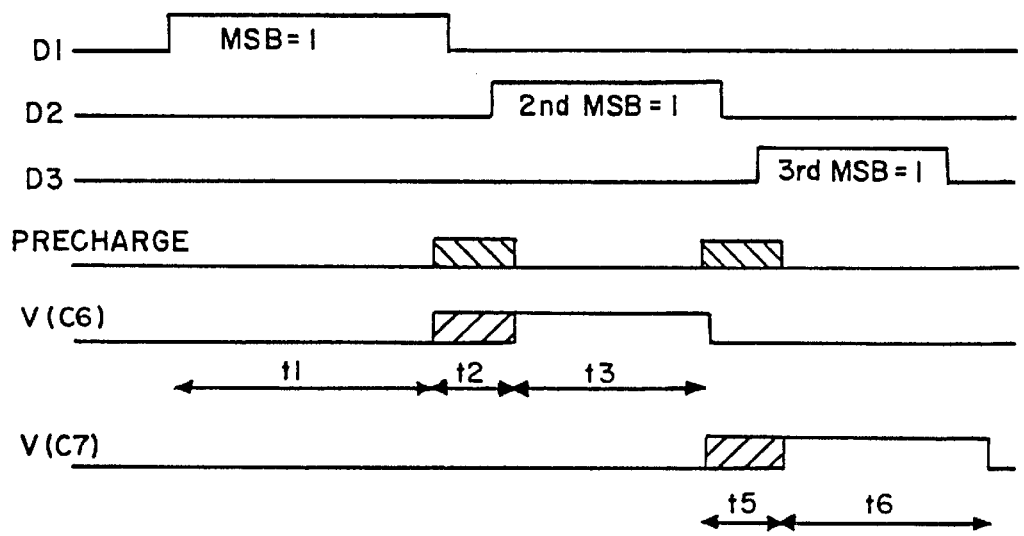
FIG. 6 is a timing diagram illustrating the operation of the precharge circuitry of FIG. 5 for part of a conversion cycle.

FIG. 6 is a timing diagram which illustrates the operation of the precharge circuitry 120 for the test of the second most significant bit for either bipolar or unipolar operation. This diagram shows three bit switching control signals D1–D3 for the three most significant bits, a precharge signal, and partial switch control voltages V(C6) and V(C7). These are internal control signals used within the digital controller 18 to develop the switch control signals on the precharge control bus 152.

At the end of the most significant bit trial time t1, the second capacitor 22 (for the second most significant bit) precharges over a first precharge interval t2. During this interval, the second three-way switch 134 connects the voltage on the second terminal of the second capacitor 22 to the precharge reference voltage 154. The control signal on the second control line 144, which drives the second three-way switch, is the result of a logical AND operation between a delayed version of the most significant bit switching signal D1 and the precharge signal.

After the precharge interval, a charging period t3 begins, in which the second three-way switch 134 connects the buffered reference voltage 102 to the second capacitor 22. At the end of the charging period, the second bit is tested by latching the comparator output. In a similar fashion, the third capacitor 24 precharges during another precharge interval t5, charges further during another charging period t6, and is then tested at the end of that charging period. This sequence proceeds until the two lowest bits are selected.

Typical precharge duration is 30 nanoseconds and is dependent upon the DAC switch/capacitor time constant. The precharge operation generally charges the capacitors to within about [plus-or-minus] ten percent of the reference voltage. The buffered reference voltage node 102 therefore only needs to supply enough current to adjust the voltage on the capacitor by this last ten percent. This disrupts the voltage on the buffered reference voltage node by less than would otherwise be the case without the precharging. The capacitors can therefore charge more quickly, which allows for faster operation, more precise operation, or both. The four least significant bits are not precharged, because their small capacitance does not justify the additional overhead. The invention is not limited, however, to this number.

Figure 7:
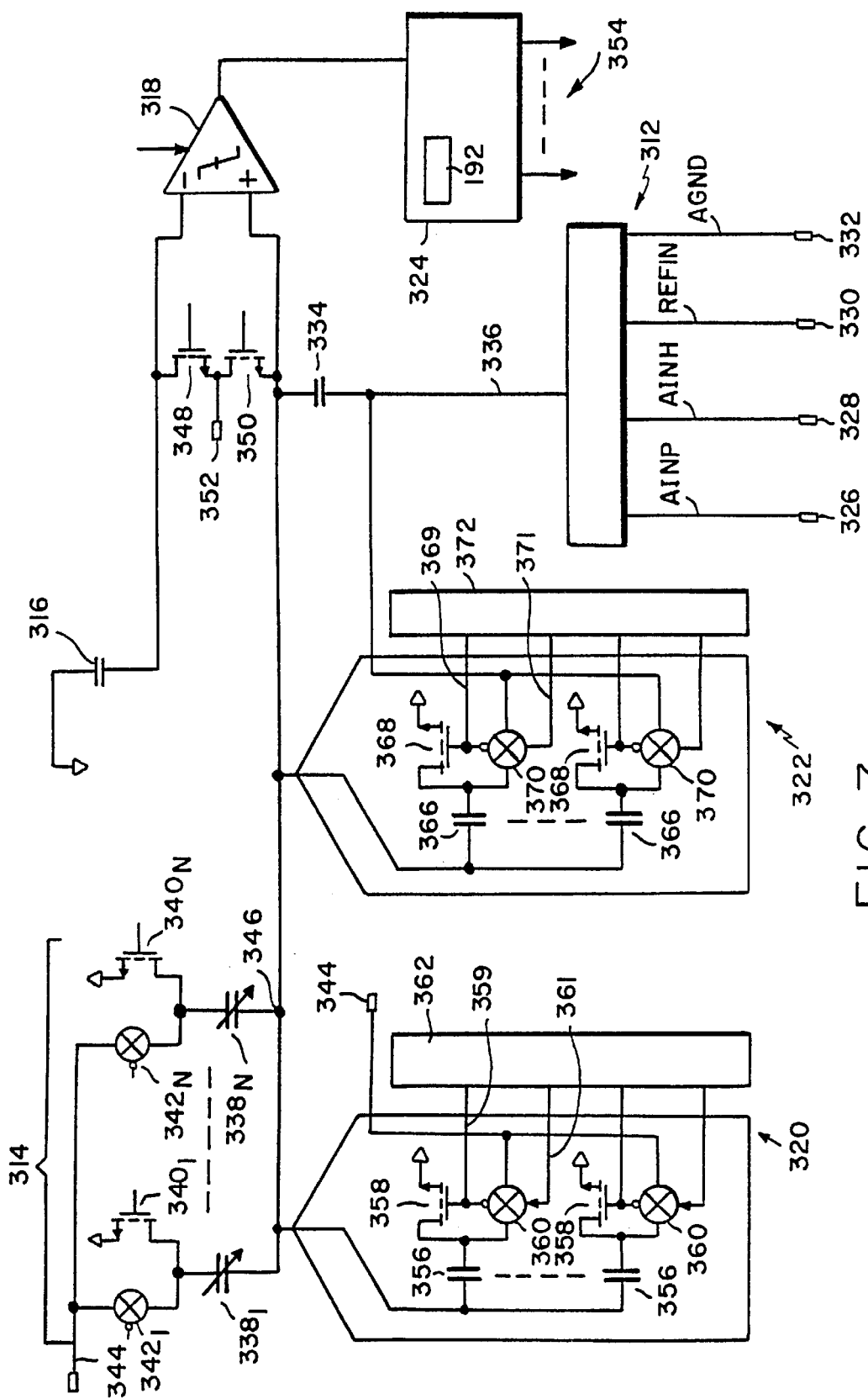
FIG. 7 is a block diagram of a second analog-to-digital converter including calibration circuitry according to the invention.

Referring to FIG. 7, a second embodiment of an analog-to-digital converter according to the invention, which includes calibration circuitry, will now be presented. This circuit 310 is preferably combined in a CMOS integrated circuit with the analog-to-digital converter circuitry discussed above, including the precharge circuitry as described in connection with FIGS. 1–6. This embodiment is presented here as a partially simplified converter circuit, however, to clarify the description of the structure and operation of its calibration circuitry.

A converter 310 according to this aspect of the invention includes an input multiplexer 312, a digital-to-analog converter 314, a dummy array capacitor 316, a comparator 318, an offset trim array circuit 320, a gain trim array circuit 322, and a calibration controller 324. The calibration controller is preferably part of the control circuit for the analog-to-digital converter (label 18 on FIG. 2).

The input multiplexer is responsive to a positive analog input 326, a negative analog input 328, a reference input 330, and a ground input 332. The multiplexer's output 336 is provided to a first terminal of a sampling capacitor 334 and to a first terminal of the gain trim array circuit 320. The multiplexer is made up of four switches controlled by the control circuitry for the converter, as was presented above in connection with FIG. 2. The comparator 318 used in the analog-to-digital converter 310 can be a precision CMOS comparator, such as the comparator described in the above-mentioned co-pending application.

The digital-to-analog converter 314 includes an array of binary-weighted capacitors $338_1 \ldots 338_N$, each of which has a terminal provided to a respective one of grounding switches $340_L \ldots 340_N$. This terminal is also provided to a respective one of reference switches $342_L \ldots 342_N$, which can each supply it with a reference voltage from a reference voltage terminal 344. The combined capacitance of this array, the sampling capacitor 334, the gain trim array circuit 322, and the offset trim array circuit 320 preferably matches the capacitance of the dummy array capacitor 316, which is between ground and an inverting input of the comparator 318. The other terminals of all of the capacitors (at node 346) are provided to a second terminal of the offset trim array circuit 320, to a second terminal of the gain trim array circuit 322, to the second terminal of the sampling capacitor 334, and to a non-inverting input of the comparator 318. The DAC can be constructed as described in connection with FIGS. 2 or 5.

The inverting input of the comparator 318 is responsive to a first common-mode switch 348 leading to a common-mode voltage terminal 352, and the non-inverting input of the comparator is similarly responsive to a second common-mode switch 350, which also leads to the common-mode voltage terminal. This common-mode voltage terminal can be supplied with a common-mode voltage as described above in connection with FIGS. 2–4. A latched digital output of the comparator is provided to the calibration controller 324.

The calibration controller 324 is a digital control circuit which provides sequential control signals 354 that govern the various operations of the analog-to-digital converter described herein. For example, it provides actuation signals to the various switches 340, 342, 348, 350, input selection signals to the multiplexer 312, and switching control words to the calibration RAMs 362, 372. It also interfaces with external circuitry via serial input and output lines, and a control register 192, which will be discussed below. This digital control circuitry can be implemented using straightforward sequential digital logic design techniques, given the required sequence of output signals, which will also be discussed below.

The offset trim array 320 includes an array of capacitors 356, which are preferably binary-weighted with a slight negative differential non-linearity to allow for device errors. In one embodiment, the array comprises fourteen capacitors with the six most significant bits being binary-scaled, a non-linearity inserted at the seventh bit, and the remaining least significant bits also being binary-scaled. Each capacitor has a first electrode connected to the non-inverting input of the comparator, and a second electrode connected to both a respective grounding switch 358 and to a respective input switch 360. Each input switch can operatively connect its respective second capacitor electrodes to the reference voltage on lead 344; and each grounding switch can operatively connect its respective second capacitor electrode to ground.

Each input switch 360 is made up of an NMOS and a PMOS device coupled in parallel to form a bi-directional switch. The grounding switches 358 and the input switches 360 are responsive to respective bits in a control word presented on switch driver output lines (359 and 361, respectively) of the offset calibration RAM 362. These switches can therefore connect each second capacitor electrode to either a buffered version of the reference voltage or ground, depending on the value of its corresponding control bit from the RAM. The result is that the offset trim array acts like a digitally controlled adjustable capacitor.

The gain trim array 322 similarly includes an array of capacitors 366, which are preferably binary-weighted with a predetermined non-linearity. Each capacitor has a first electrode connectable to node 346 (and, thus, via capacitor 334 to the output 336 of the multiplexer 312), and a second electrode connectable to both a respective grounding switch 368 and to a respective input switch 370. Each grounding switch can operatively connect its respective second capacitor electrode to ground; and each input switch can operatively connect its respective second capacitor electrode to the multiplexer output. These two groups of switches are responsive to respective bits in a control word presented on switch driver output lines 369 and 371 of a gain calibration RAM 372. Like the offset trim array, therefore, the gain trim array acts like a digitally controlled adjustable capacitor.

The analog-to-digital converter 310 can perform several types of calibration. One of these is a gain calibration, which adjusts the extent of the digital output response to a given analog input voltage. Another is an offset calibration, which calibrates the desired "zero" voltage for the analog-to-digital converter.

Both of these types of calibration can be performed either as a "device calibration" or a "system calibration". A device calibration calibrates the device with the full scale voltage connected to the voltage on the reference input 330, and the "zero" voltage connected to the ground input 332. A system calibration, on the other hand, calibrates the converter for user-selected voltage values. It is noted that each of the capacitors 338 may also be calibrated to compensate for device errors or drifts using further calibration circuitry, which is not shown.

In order to understand the calibration operations, it is useful to derive a model of the conversion process. As discussed above, conversions proceed according to the principle of charge redistribution, in which a charge proportional to the voltage to be measured is first trapped, and the digital-to-analog converter is then used to measure this charge by successive approximation. Each of these conversions begins with the positive analog input 326 of the multiplexer (Ainp) selected during a signal acquisition phase. A compare phase then follows, during which the negative analog input 328 of the multiplexer (Ainm) is selected. This type of sequence is referred to as psuedo-differential sampling.

The voltage at the non-inverting input of the comparator 318 during the compare phase expresses a comparison between the voltage detected on the positive analog input 326 during the signal acquisition phase and the voltage detected on the negative voltage input 328 during the compare phase. This voltage, V(ncp), can be determined by applying the principle of charge-conservation, and is given by the following:

$$V(ncp) = Vcm + \left[ \frac{Vref \times C \times \sum_{j=0}^{n-1} (b_j \times 2^{-j}) - Cs \times (Ainp - Ainm) + Vref \times Cos}{Ctot} \right] \quad \text{(Eq. 12)}$$

where C is the capacitance of the largest capacitor in the DAC array, Ctot is the total capacitance on the non-inverting input of the comparator 318, Cs is the capacitance of the sampling capacitor, and Cos is the capacitance of the offset trim array 320. The voltage at the negative input is equal to the common-mode voltage Vcm at node 352, and the digital bits $b_j$ have values of either 0 or 1. The differential input signal (Ainp−Ainm) is normally in the range from zero to the reference voltage at the reference voltage terminal 344 (Vref).

Eq. 12 can be re-written as follows:

$$V(ncp) = Vcm + \left[ \frac{Vref \times Cdac - Cs \times (Ainp - Ainm) + Vref \times Cos}{Ctot} \right]$$

where Cdac is the total capacitance of the capacitor array of the digital-to-analog converter 314. At charge balance, the above term in brackets is forced to zero by the successive approximation process. This may be expressed as:

$$Vref \times Cdac - Cs \times (Ainp-Ainm) + Vref \times Cos = 0 \quad \text{(Eq. 13)}$$

This equation can be used to analyze the system calibration process. The normal calibration sequence is to first calibrate the capacitors 338 in the main DAC and to perform a full device gain and offset calibration. A system calibration of gain and offset then follows.

In a system gain calibration, the desired full scale voltage (Vfs) is applied to the positive voltage input 326 of the multiplexer 312, and a calibration is performed by sampling the full scale voltage on the sampling capacitor 334. The result of this operation is compared against the full scale voltage of the DAC, with all of the main DAC switches connected to the reference voltage Vref.

The effective value of the sampling capacitor 334 is then adjusted by iteratively loading values into the gain calibration RAM 372, until a particular parallel combination of the capacitors 366 in the gain trim array 322 and the sampling capacitor achieves a charge balance. During this gain calibration, it is assumed that the voltage on the negative voltage input 328 of the multiplexer is the common-mode voltage Vcom (i.e., ground in unipolar mode, and Vref/2 in bipolar mode). In accordance with Eq. 13, the charge balance equation after the calibration sequence is:

$$Vref \times Cdacfs - Cs1 \times (Vfs-Vcom) = 0 \quad \text{(Eq. 14)}$$

where Cdacfs is the full scale capacitance of the DAC array and Cs1 is the value of the sampling capacitor after the gain calibration. The offset trim array capacitance, Cos, is set to zero during this operation.

In a system offset calibration, the desired "zero" voltage (Vz) is applied to the positive analog input 326 of the multiplexer 312. The calibration is then performed by sampling this desired "zero" voltage on the sampling capacitor and comparing it to the "zero" scale voltage of the DAC. During this comparison, all of the main DAC grounding switches 340 are closed in order to ground their respective capacitors 338, and thereby set the capacitance of the DAC equal to zero.

The capacitance of the offset trim array (Cos) is then iteratively adjusted to achieve a charge balance. During this offset calibration, it is assumed that the voltage on the negative analog input 328 of the multiplexer is the common-mode voltage. According to Eq. 13, the charge balance equation after the calibration sequence is:

$$Vref \times Cos1 - Cs1 \times (Vz-Vcom) = 0 \quad \text{(Eq. 15)}$$

where Cos1 is the value of the offset trim array capacitor after the offset calibration.

The process of calibration changes the transfer function of the analog-to-digital converter 310. After the first gain and offset calibration, the converter's charge balance equation becomes:

$$Vref \times Cdac - Cs1 \times (Ainp-Vcom) + Cs1 \times (Vz-Vcom) = 0 \quad \text{(Eq. 16)}$$

To determine the gain and offset errors after calibration, either Vfs or Vz can be substituted for Ainp in Eq. 16 and the value of the capacitance of the DAC can be determined. For a zero offset, it was required that the capacitance of the DAC be zero when Ainp=Vz. For a zero gain error, the capacitance of the DAC was required to be equal to the full scale capacitance of the DAC when Ainp is equal to the full scale voltage. By setting Ainp equal to Vz in Eq. 16, at charge balance Vref×Cdac is equal to zero. In other words, the capacitance of the DAC is equal to zero, so there is no offset error.

If Ainp is then set to be equal to the full scale voltage Vfs in Eq. 16, at charge balance:

$$Vref \times Cdac - Cs1 \times (Vfs - Vz) = 0$$

$$Vref \times Cdac - Vref \times Cdacfs \times (Vfs - Vz/Vfs - Vcom) = 0$$

$$Cdac = Cdacfs(1 - (Vz - Vcom)/(Vfs - Vcom)) \qquad \text{(Eq. 17)}$$

Since the capacitance of the DAC is not equal to the full scale capacitance of the DAC, there is a gain error. The gain error as a percentage of full scale is given by:

$$\text{Gain error } (\%) = (Vz - Vcom)/(Vfs - Vcom) \times 100 \qquad \text{(Eq. 18)}$$

Performing a single gain and offset calibration has removed the offset error, but some gain error still remains. If there is no initial offset error, however, then there is no gain error after the calibration sequence (i.e., Vz=Vcom). In addition, in a "device" calibration, with Vz and Vcom equal to zero and Vfs equal to the voltage on the reference input 330, a single offset and gain calibration removes both offset and gain errors. This occurs because the same voltage (0 volts) is sampled and compared in both calibrations. The value of the sampling capacitor does not matter during the offset calibration, and as a result there is no interaction between the offset and gain calibrations.

Instead of a single system gain calibration followed by an offset calibration, this sequence can be performed N times. Using an analysis similar to the one performed above, it can be shown that after a series of N calibration sequences, the offset and gain errors are given by:

Offset error=0

$$\text{Gain error } (\%) = [(Vz - Vcom)/(Vfs - Vcom)]^N \times 100 \qquad \text{(Eq. 19)}$$

This result indicates that a repeated application of the basic gain and offset calibration sequence rapidly forces the system gain error to zero. As the calibration sequence is repeated, a history of the inputs is compiled and the errors approach zero. This happens because the offset and gain calibration RAMs 362, 372 are not reset between calibrations. The error convergence can be seen more clearly by replacing the term in brackets in Eq. 19 by $2^{-x}$. The gain error then becomes:

$$\text{Gain error } (\%) = 2^{-NX} \times 100 \qquad \text{(Eq. 20)}$$

According to this equation, if the initial system offset and gain errors are at the "x bit level," after a calibration sequence they are reduced as shown in Table 1.

TABLE 1

| No. of System gain and offset calibrations (N) | System offset error | System gain error |
| --- | --- | --- |
| N = 0 (i.e., initial errors) | 1 LSB5 (+/− 3.12%) | 1 LSB5 |

TABLE 1-continued

| No. of System gain and offset calibrations (N) | System offset error | System gain error |
| --- | --- | --- |
| N = 1 | 0 | 1 LSB5 |
| N = 2 | 0 | 1 LSB10 |
| N = 3 | 0 | 1 LSB15 |

The system offset and gain errors are limited by calibration array resolution and system noise. The system calibration trim range in one embodiment is approximately ±3% of full scale for both offset and gain. If the initial system offset and gain errors are at the 6-bit level, for example, then in order to reduce these errors to the 12-bit level, the gain and offset calibration should be performed twice in that sequence. This calibration sequence performs the general 2-point system calibration within the bounds imposed by the calibration trim range.

Referring to FIG. 7, the control register 192 preferably includes five control bit locations 182, 184, 186, 188, 190, for use in calibration control. The designer employing the integrated circuit can supply an appropriate command code to this register to perform a calibration, and may re-send the command codes a sufficient number of times to achieve the desired error level.

The least significant bit 180 of the control register responds to a logic "one" by starting a calibration operation. The next two bits 182, 184 accept a code that selects between four types of calibrations: gain (code 11), offset (code 01), both offset and gain (code 10), and "full" (code 00). The "full" calibration includes a calibration of the DAC, the offset error, and the gain error. Generally, the full calibration command should not be needed as often as the other commands. The fourth bit 186 selects whether a calibration is a device calibration or a system calibration. The fifth bit 188 responds to a logic "one" by beginning an analog-to-digital conversion. This bit doubles as a hand-shaking bit between individual calibrations in compound calibration operations, as will be described below. The most significant bit 190 is a status bit, which indicates whether the part is busy performing calibrations or conversions. The remaining bits are used in channel selection and power management, and do not from a part of the present invention.

Figure 8:
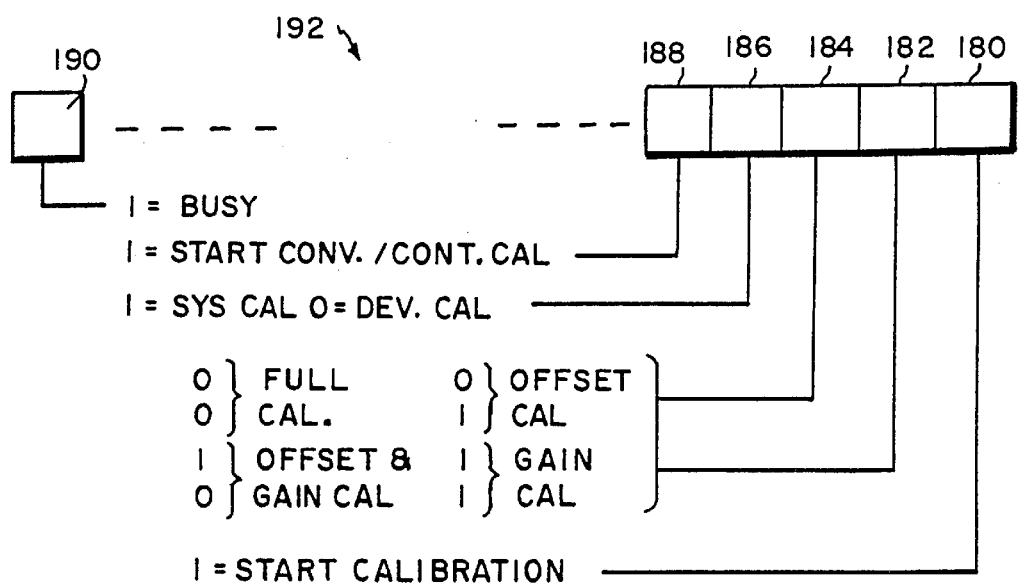
FIG. 8 is a control bit map for the control register of the converter of FIG. 7.
Figure 9:
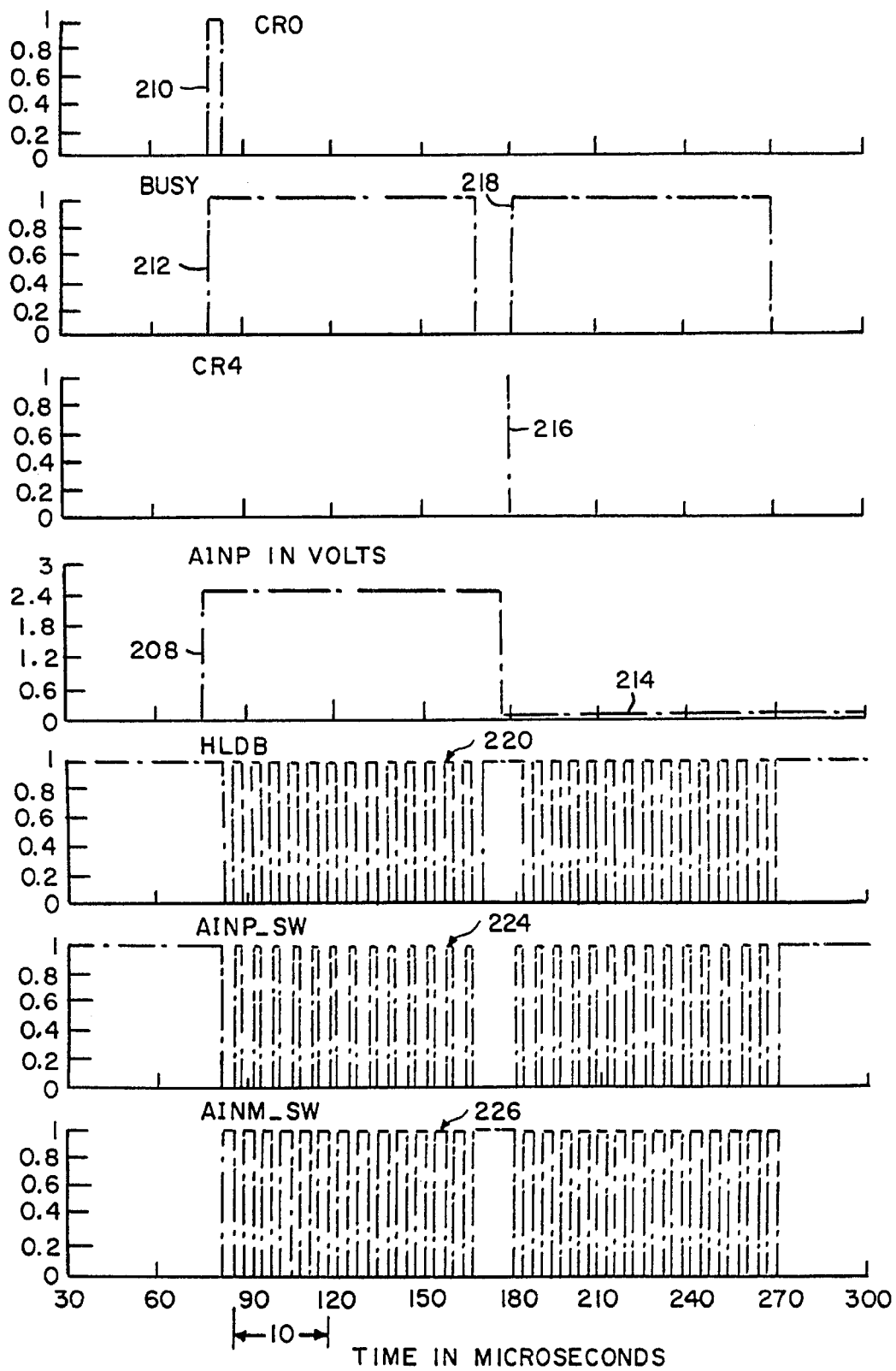
FIG. 9 is a timing diagram for a system gain calibration followed by a system offset calibration, for system signals and converter control signals in the circuit of FIG. 7.

Referring to FIGS. 7–9, operation of the analog-to-digital converter 310 during a system calibration sequence will now be presented. Generally, a processor and/or other surrounding circuitry that is wired to communicate with the analog-to-digital converter will initiate this type of sequence. This surrounding circuitry will be referred to as the "system."

The system begins a system calibration by supplying an analog calibration voltage to the positive analog input terminal 326 (pulse 208). It then asserts the calibration start bit 180 in the control register 192, and places a calibration type select code of "10" in the second and third calibration bit locations 182, 184 of the control register 192 (pulse 210). This code selects both a gain and a system calibration. The converter responds by asserting the busy bit 190 in the control register (pulse 212), and this busy signal remains asserted while a single gain calibration is performed. The system monitors the status of this calibration by polling the busy bit via the converter's serial input (not shown).

The system detects the completion of the gain calibration by sensing the end of the busy pulse 212. It then removes the positive input voltage from the positive analog input 326, and replaces it with a negative calibration voltage (level 214). It indicates the presence of this voltage to the converter by asserting the start convert bit 188 (pulse 216), which acts as a handshaking bit for this operation. The analog-to-digital converter responds by reasserting the busy bit 190 (pulse 218), and begins the offset portion of the calibration. As in the gain calibration cycle, the system polls the busy bit during this calibration operation.

Figure 10:
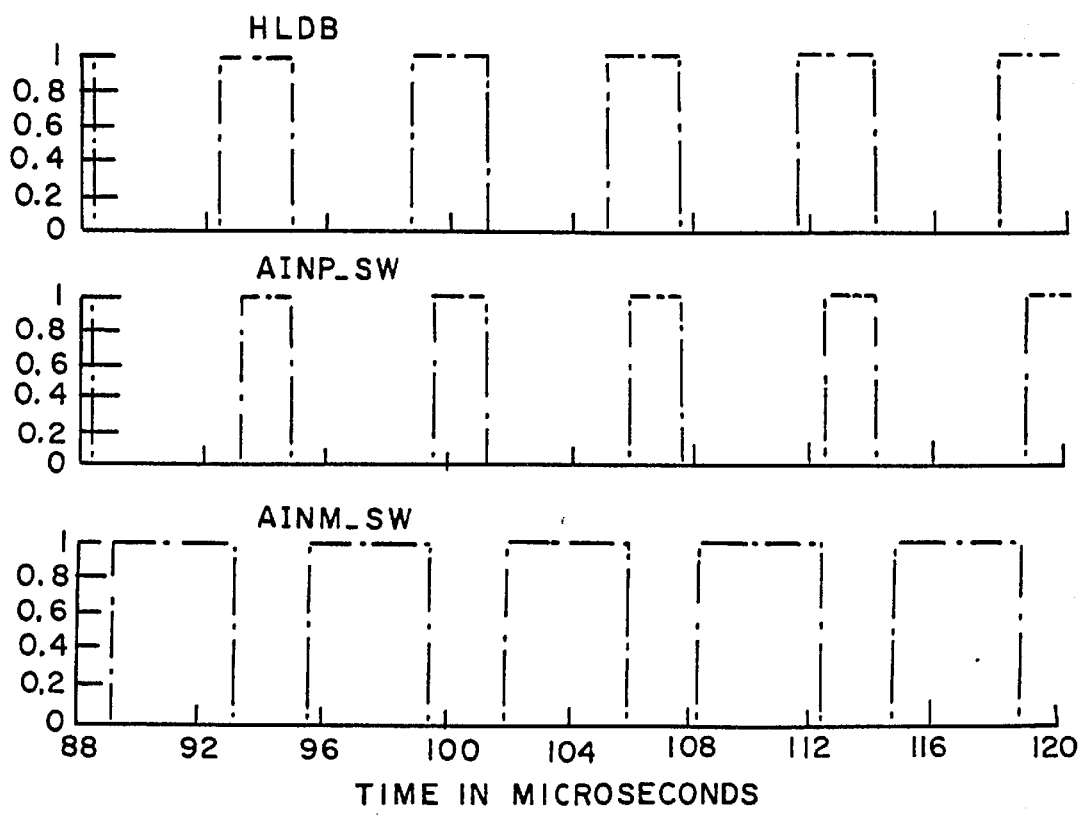
FIG. 10 is a timing diagram illustrating a subset of the signals of FIG. 9, for the period designated "10" in FIG. 9, shown on an expanded time scale.

The offset calibration operation includes 14 successive sampling and testing operations. The sampling operations are repeated to avoid inaccuracies that could be introduced by leakage. This allows the calibration to operate relatively slowly, so that the comparator and other circuitry have ample time to settle, thereby increasing accuracy. The hold line 352, the second analog input switch of the mulitplexer 312, and the third analog input switch of the mulitplexer, are therefore toggled a total of 14 times during this busy period (pulse trains 220, 224, 226, respectively). These pulses follow the conversion sequence described above in connection with the first embodiment of the invention, as shown in FIG. 10.

Figure 11:
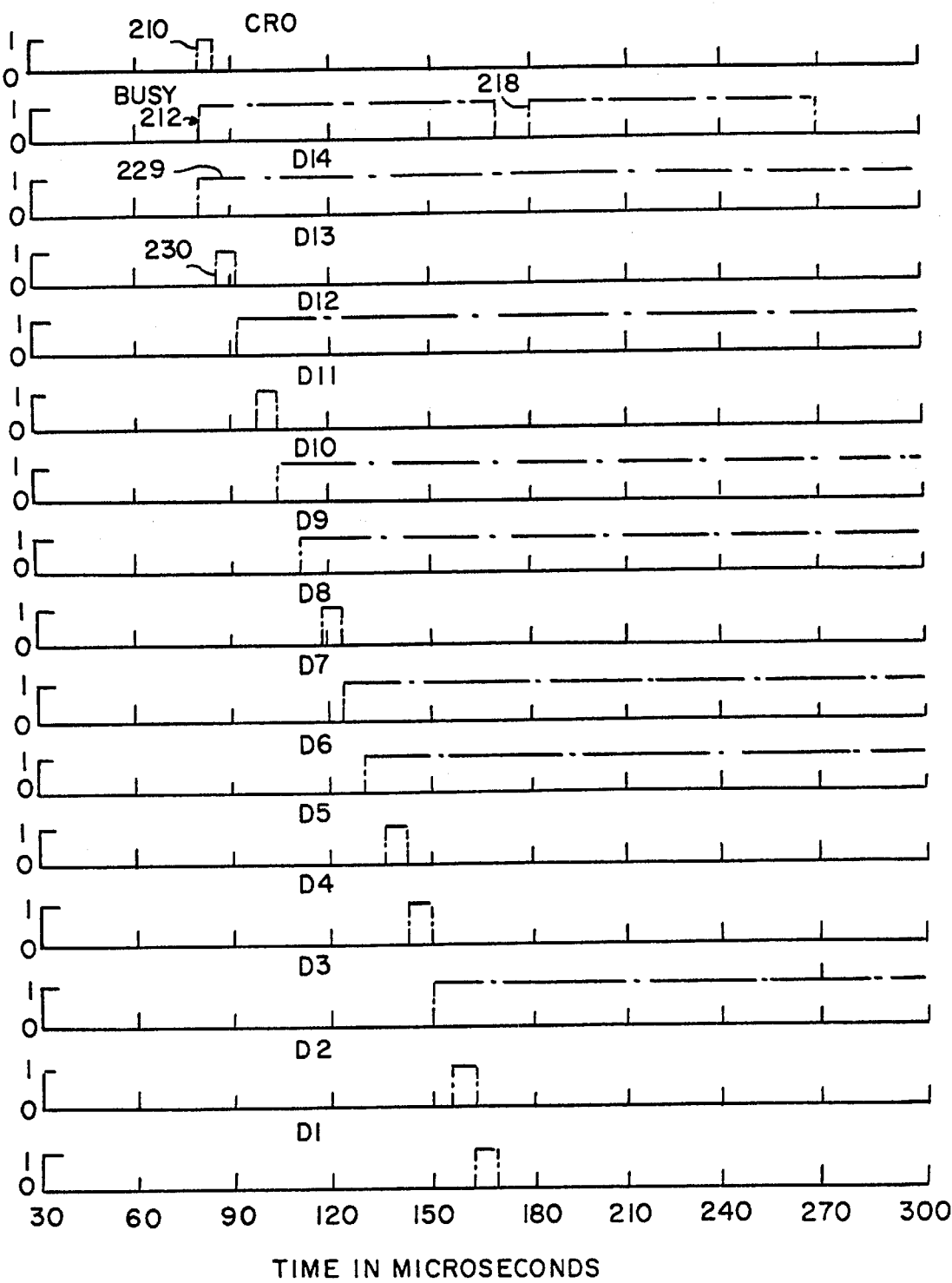
FIG. 11 is a timing diagram illustrating the states of the gain calibration RAM bits, shown on the same scale as FIG. 9.

Referring to FIGS. 7 and 11, the change stored in each of the sampling operations is tested with one bit of the gain calibration array 322 during the gain calibration. The most significant bit (D14) in this array is tested first, by comparing the voltage on the parallel combination of the MSB capacitor and the sampling capacitor 334 with the full-scale voltage of the DAC. If the voltage on the sampling capacitor sampling capacitor is found to be larger than the voltage on the MSB capacitor, the bit for the MSB capacitor in the gain calibration RAM 72 is left at one (level 229). It is noted that the MSB capacitor of the trim arrays can be switched in a bipolar manner, to achieve bipolar calibration values.

This operation is then repeated for the next-most significant bit. If the voltage supplied by the combination of most- and second-most significant bit capacitors is higher than the freshly sampled charge on the sampling capacitor 334, the second-most significant bit's location in the gain control RAM 372 is returned to zero (edge 230). This process is repeated for each bit, up to the least significant bit. After the calibration operation depicted in FIG. 11, the gain trim array 322 would contain a binary value of: 10 1011 0110 0100.

Figure 12:
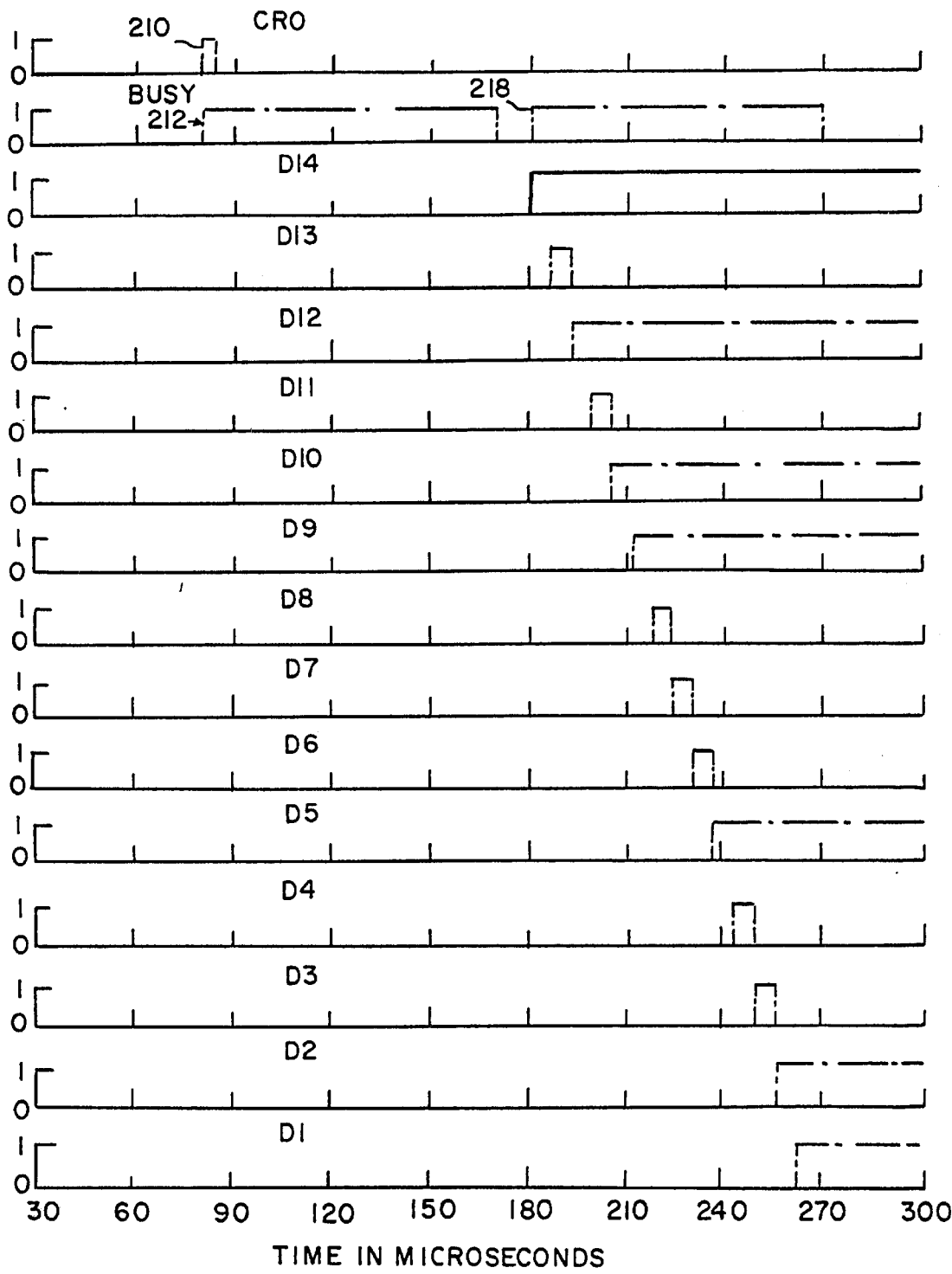
FIG. 12 is a timing diagram illustrating the offset calibration RAM bits during an offset calibration, shown on the same scale as FIG. 9.

Referring to FIGS. 7 and 12, the offset calibration uses a similar iterative process, except that the calibration is performed by sampling the desired "zero" voltage on the sampling capacitor and comparing it to the "zero" voltage of the DAC. Upon completion of the offset calibration operation depicted in FIG. 12, the offset calibration RAM 362 would contain a binary value of: 10 1011 0001 0011.

Figure 13:
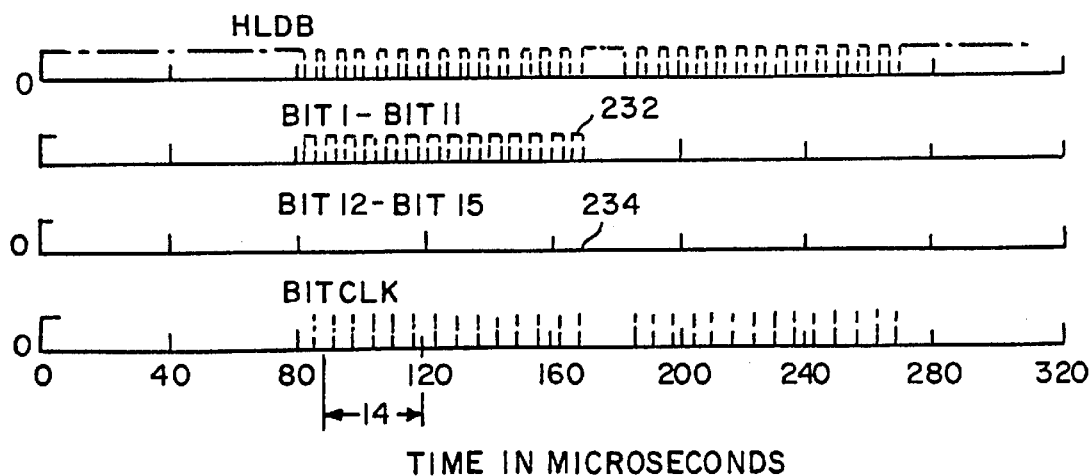
FIG. 13 is a timing diagram illustrating the main DAC array control signals during the calibrations of FIGS. 9–12, shown on a contracted scale with respect to FIG. 9.
Figure 14:
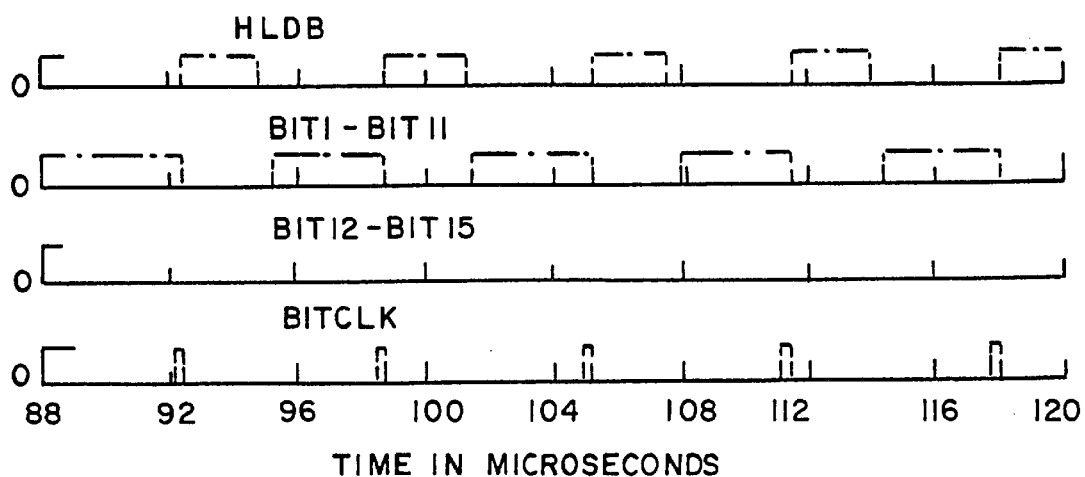
FIG. 14 is a timing diagram showing the signals of FIG. 13 for the period designated by "14" in FIG. 13, shown on an expanded time scale.

Referring to FIGS. 7 and 13, it is noted that the main DAC switches are connected to the reference voltage Vref during the comparisons in the gain calibration, (pulse train 232) and this operation is shown in more detail in FIG. 14. The four least significant bits, however, are not switched as part of this operation (level 234). Instead, a substitute capacitor (not shown) having a value of sixteen times the least significant bit (LSB) is switched. This approach improves calibration accuracy, because switching a single large capacitor is more accurate than switching several smaller capacitors. It also allows the total capacitance of the main DAC array to be equal to twice the capacitance of the largest capacitor in the array, rather than twice the capacitance of the largest capacitor in the array minus the capacitance of the capacitor for the least significant bit. The capacitance of the main DAC array is therefore equal to the capacitance of the sampling capacitor during the gain calibration. Note that the fifteenth bit is used to offset the ADC transfer function by half of an LSB.

The "BITCLK" signal is used to time the switching of the main DAC switches for this operation. This internal signal is also provided to a counter (not shown), which generates successive control signals to the bits to be tested in the trim arrays.

The analog-to-digital converter integrated circuit may be provided in a multi-channel version. In this version, the input multiplexer has several more analog inputs, such as a total of 8 or 16 of them. These inputs can be referenced to each other and used in pairs, or they can be used alone with reference to the ground input.

While there have been shown and described in various embodiments of the present invention, such embodiments are provided by way of example only and it will be obvious to those skilled in the art that various changes and modifications may be made therein without departing from the scope of the invention as defined by the appended claims.

What is claimed is:

1. An analog-to-digital converter calibration method for a charge redistribution analog-to-digital converter, comprising:

receiving a voltage defining a user-selected voltage range, adjusting an input offset of an input of the analog-to-digital converter based on the user-selected voltage range, adjusting a gain of the analog-to-digital converter based on the user-selected voltage range, repeating the steps of adjusting until a predetermined level of error is achieved for the analog-to-digital converter, and converting an analog voltage to a digital value by successively testing a sampled charge with a capacitive network using the analog-to-digital converter after the step of repeating.

2. The method of claim 1 wherein the steps of adjusting are performed by adjusting capacitances used in the step of converting.

3. The method of claim 1 wherein the step of adjusting a gain is performed by adjusting an effective capacitance of a sampling capacitor used to sample charge in the step of converting.

4. The method of claim 1 wherein the step of converting includes testing a charge with a capacitor array and wherein the step of adjusting a gain is performed by adjusting a capacitance in parallel with the capacitor array.

5. The method of claim 1 wherein at least one of the steps of adjusting includes storing a calibration value, and wherein the step of repeating updates that value.

6. The method of claim 1 wherein each of the steps of adjusting include storing a respective calibration value, and wherein the step of repeating updates those values.

7. The method of claim 1 wherein the steps of adjusting and repeating are each responsive to a respective step of providing a selected one of a plurality of predetermined calibration commands to a calibration command register.

8. The method of claim 1 further including the steps of adjusting the gain and adjusting the offset with reference to power supply voltages of the analog-to-digital converter.

9. The method of claim 1 wherein the step of converting is performed by charge redistribution, and wherein the steps of adjusting are performed by adjusting capacitances used in the charge redistribution; wherein the step of converting includes sampling a voltage with a sampling capacitor and wherein the step of adjusting a gain is performed by adjusting an effective capacitance of the sampling capacitor; wherein the step of converting includes testing a charge with a capacitor array and wherein the step of adjusting a gain is performed by adjusting a capacitance in parallel with the capacitor array; wherein each of the steps of adjusting include storing a respective calibration value, and wherein the step of repeating updates those values; wherein the steps of adjusting and repeating are each responsive to a respective step of providing a selected one of a plurality of predetermined calibration commands to a calibration command register; and further including the steps of adjusting the gain and adjusting the offset with reference to power supply voltages of the analog-to-digital converter.

10. A charge redistribution analog-to-digital converter, comprising:

a sampling capacitor responsive to a sampling input of the analog-to-digital converter, a capacitor array operatively connected to the sampling capacitor, an offset correcting circuit operatively connected in parallel with the capacitor array and responsive to the sampling input of the analog-to-digital converter, a gain correcting circuit operatively connected in parallel with the sampling capacitor and responsive to the sampling input of the analog-to-digital converter, and wherein each of the offset correcting circuit and the gain correcting circuit comprises a series of memory elements and a capacitor array, each array comprising a series of capacitors operatively connected to respective switches, wherein the switches of the gain correcting circuit are respectively responsive to the memory elements of the gain correcting circuit, and wherein the switches of the offset correcting circuit are respectively responsive to the memory elements of the offset correcting circuit.

11. The analog-to-digital converter of claim 10 wherein the array in each of the offset correcting circuit and the gain correcting circuit comprises a switched, generally binarily-weighted capacitor ladder which includes a predetermined nonlinearity.

12. The analog-to-digital converter of claim 10 further including an input multiplexer between the sampling input of the analog-to-digital converter and the sampling capacitor.

13. The analog-to-digital converter of claim 12 wherein the input multiplexer is operable to select from among the sampling input, a reference input, and a ground input.

14. The analog-to-digital converter of claim 12 wherein the input multiplexer is operable to select from among the sampling input and another sampling input.

15. The analog-to-digital converter of claim 12 wherein the input multiplexer is operable to select from the sampling input and a further plurality of sampling inputs.

16. The analog-to-digital converter of claim 10 further including a control register and wherein the gain correcting circuit and the offset correcting circuit are responsive to the control register.

17. The analog-to-digital converter of claim 10 wherein the sampling capacitors, the capacitor array, the offset correcting circuit and the gain correcting circuit are disposed within a single monolithic semiconductor structure.

18. The analog-to-digital converter of claim 10 wherein the offset correcting circuit and the gain correcting circuit each comprise a memory element, wherein the arrays in the offset correcting circuit and the gain correcting circuit are each generally binary-weighted, further including an input multiplexer between the sampling input of the analog-to-digital converter and the sampling capacitor, wherein the input multiplexer is responsive to the sampling input, a reference input, a ground input, and to another sampling input, further including a comparator responsive to the capacitor array, and further including a control register and wherein the memory elements of the gain correcting circuit and the offset correcting circuit are responsive to the control register.

19. The analog-to-digital converter of claim 18 wherein the input multiplexer is responsive to the sampling input and to a further plurality of sampling inputs.

20. The analog-to-digital converter of claim 18 wherein the sampling capacitors, the capacitor array, the offset correcting circuit and the gain correcting circuit of the converter are disposed within a single monolithic semiconductor structure.

21. A charge redistribution analog-to-digital converter, comprising:

capacitive sampling means responsive to a sampling input means of the analog-to-digital converter for sampling a voltage at the sampling input means, capacitive digital-to-analog conversion array means operatively connected to the capacitive sampling means and for testing a stored quantity of charge, means for correcting an offset of the analog-to-digital converter, operatively connected in parallel with the capacitive digital-to-analog conversion array means capacitor array, and responsive to the sampling input means of the analog-to-digital converter, means for correcting a gain of the analog-to-digital converter, operatively connected in parallel with the capacitive sampling means and responsive to the sampling input means of the analog-to-digital converter, wherein the means for correcting an offset and the means for correcting a gain each comprise means for storing a calibration value, wherein the means for correcting an offset and the means for correcting a gain each comprise capacitive array means, which comprises a series of capacitive means operatively connected to respective means for switching, wherein the means for switching of the means for correcting a gain are responsive to respective elements of the means for storing of the means for correcting a gain, and wherein the means for switching of the means for correcting an offset are responsive to respective elements of the means for storing of the means for correcting an offset.

22. The analog-to-digital converter of claim 21 wherein the capacitive array means in the means for correcting an offset and in the means for correcting a gain are each generally binary-weighted and each include a predetermined non-linearity.

23. The analog-to-digital converter of claim 21 further including means for selecting responsive to the sampling input means and for selecting between the sampling input means, a reference input means, and a ground input means.

24. The analog-to-digital converter of claim 23 wherein the means for selecting is responsive to the sampling input means and to a further plurality of sampling input means.

25. The analog-to-digital converter of claim 21 further including means for receiving a calibration command and wherein the means for correcting a gain and the means for correcting an offset are responsive to the means for receiving a calibration command.

26. The analog-to-digital converter of claim 21 wherein the capacitive sampling means, the capacitive digital-to-analog conversion array means, the means for correcting an offset, and the means for correcting a gain are disposed within a single monolithic semiconductor structure.

27. The analog-to-digital converter of claim 21 wherein the capacitive array means in the means for correcting an offset and the means for correcting a gain each comprise generally binary-weighted capacitive array means, further including means for selecting responsive to the sampling input means and for selecting between the sampling input means, a reference input means, a ground input means, and another sampling input means, and further including means for receiving a calibration command and wherein the means for correcting a gain and the means for correcting an offset are responsive to the means for receiving a calibration command.

28. The analog-to-digital converter of claim 27 wherein the means for selecting is responsive to the sampling input means and to a further plurality of sampling input means.

29. The analog-to-digital converter of claim 27 wherein the capacitive sampling means, the capacitive digital-to-analog conversion array means, the means for correcting an offset, and the means for correcting a gain are disposed within a single monolithic semiconductor structure.

30. An analog-to-digital converter calibration method for a charge redistribution analog-to-digital converter, comprising:

receiving a digital gain calibration signal, adjusting a gain of the analog-to-digital converter by an amount determined by the digital gain calibration signal received in the step of receiving a digital gain calibration signal, receiving a digital offset calibration signal, adjusting an input offset of an input of the analog-to-digital converter by an amount determined by the digital offset calibration signal received in the step of receiving a digital offset calibration signal, and after the steps of adjusting, converting an analog voltage to a digital value by successively testing a sampled charge with a capacitive network using the analog-to-digital converter, wherein the steps of adjusting are performed by adjusting capacitances used in the step of converting.

31. The method of claim 30 wherein the step of adjusting a gain is performed by adjusting an effective capacitance of a sampling capacitor used to sample charge in the step of converting.

32. The method of claim 30 wherein the step of converting includes testing a charge with a capacitor array and wherein the step of adjusting a gain is performed by adjusting a capacitance in parallel with the capacitor array.

33. The method of claim 30 wherein the steps of adjusting are each responsive to a respective step of providing a selected one of a plurality of predetermined calibration commands to a calibration command register.

34. The method of claim 30 wherein the steps of adjusting are performed for a user-selected voltage range.

35. The method of claim 34 further including the steps of adjusting the gain and adjusting the offset with reference to power supply voltages of the analog-to-digital converter.

36. An analog-to-digital converter calibration method for a charge redistribution analog-to-digital converter, comprising:

receiving a first voltage defining a first user-selected voltage range, adjusting an input offset of an input of the analog-to-digital converter, adjusting a gain of the analog-to-digital converter, after the steps of adjusting, converting an analog voltage to a digital value by successively testing a sampled charge with a capacitive network using the analog-to-digital converter, wherein the steps of adjusting and the step of converting are performed with reference to the first user-selected voltage range, receiving a second voltage defining a second user-selected voltage range, again adjusting an input offset of an input of the analog-to-digital converter, again adjusting a gain of the analog-to-digital converter, and after the steps of again adjusting, again converting an analog voltage to a digital value by successively testing a sampled charge with a capacitive network using the analog-to-digital converter, wherein the steps of again adjusting and the steps of again converting are performed with reference to the second user-selected voltage range.

37. The method of claim 36 wherein the steps of adjusting and the steps of again adjusting are performed by adjusting capacitances used in the steps of converting.

38. The method of claim 36 wherein the steps of adjusting a gain and again adjusting a gain are performed by adjusting an effective capacitance of a sampling capacitor used to sample charge in the step of converting.

39. The method of claim 36 wherein the step of converting includes testing a charge with a capacitor array and wherein the step of adjusting an offset is performed by adjusting a capacitance in parallel with the capacitor array.

40. The method of claim 36 wherein the steps of adjusting are each responsive to a respective step of providing a selected one of a plurality of predetermined calibration commands to a calibration command register.

41. The method of claim 36 further including the steps of adjusting the gain and adjusting the offset with reference to power supply voltages of the analog-to-digital converter.

* * * * *